United States Patent
Kaneko et al.

(10) Patent No.: US 8,835,190 B2
(45) Date of Patent: *Sep. 16, 2014

(54) SEMICONDUCTOR APPARATUS

(75) Inventors: Kishou Kaneko, Kanagawa (JP); Naoya Inoue, Kanagawa (JP); Yoshihiro Hayashi, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 398 days.

This patent is subject to a terminal disclaimer.

(21) Appl. No.: 13/373,098

(22) Filed: Nov. 4, 2011

(65) Prior Publication Data

US 2012/0115253 A1    May 10, 2012

Related U.S. Application Data

(63) Continuation of application No. 12/453,037, filed on Apr. 28, 2009, now Pat. No. 8,072,048.

(30) Foreign Application Priority Data

May 7, 2008    (JP) ................... 2008-121527
Sep. 26, 2008    (JP) ................... 2008-249189

(51) Int. Cl.
*H01L 21/00* (2006.01)
*H01L 23/522* (2006.01)
*H01L 23/552* (2006.01)

(52) U.S. Cl.
CPC .......... *H01L 23/552* (2013.01); *H01L 23/5227* (2013.01)
USPC ...................... 438/3; 257/E21.665

(58) Field of Classification Search
CPC ................ H01L 2924/3025; H01L 23/552
USPC .................. 438/3; 257/442, 659, E21.665
See application file for complete search history.

(56) References Cited

U.S. PATENT DOCUMENTS

| | | | |
|---|---|---|---|
| 6,627,913 B2 * | 9/2003 | Chen | 257/10 |
| 6,936,763 B2 * | 8/2005 | Rizzo et al. | 174/391 |
| 7,498,663 B2 * | 3/2009 | Henmi | 257/659 |
| 7,535,755 B2 | 5/2009 | Umehara et al. | |
| 8,072,048 B2 * | 12/2011 | Kaneko et al. | 257/659 |
| 8,373,256 B2 * | 2/2013 | Kaneko et al. | 257/659 |
| 2010/0276791 A1 | 11/2010 | Kaneko et al. | |

FOREIGN PATENT DOCUMENTS

| | | |
|---|---|---|
| JP | 3-188604 | 8/1991 |
| JP | 4-174543 A | 6/1992 |
| JP | 4-364007 | 12/1992 |

(Continued)

OTHER PUBLICATIONS

Notification of Reasons for Rejection dated May 22, 2012 with an English-language translation.

(Continued)

*Primary Examiner* — Quoc Hoang
(74) *Attorney, Agent, or Firm* — McGinn IP Law Group, PLLC

(57) ABSTRACT

A method for manufacturing a semiconductor apparatus includes forming a semiconductor device on a principal surface of a substrate, in which the semiconductor device includes an interconnect layer, forming a buffer film which covers the semiconductor device and prevents diffusion of a magnetic material, and forming a magnetic shielding film which covers the buffer film and includes the magnetic material.

19 Claims, 47 Drawing Sheets

(56) References Cited

FOREIGN PATENT DOCUMENTS

| | | |
|---|---|---|
| JP | 5-144642 A | 6/1993 |
| JP | 6-21060 A | 1/1994 |
| JP | 6-120027 A | 4/1994 |
| JP | 9-7834 A | 1/1997 |
| JP | 9-330929 A | 12/1997 |
| JP | 2001-127357 A | 5/2001 |
| JP | 2005-251840 A | 9/2005 |
| JP | 2005-531928 | 10/2005 |
| JP | 2006-54229 A | 2/2006 |
| JP | 2006-237107 A | 9/2006 |
| JP | 2007-173599 A | 7/2007 |
| JP | 2007-273493 A | 10/2007 |
| JP | 2008-103603 A | 5/2008 |

OTHER PUBLICATIONS

Office Action in U.S. Appl. No. 12/453,037 dated Feb. 1, 2011.

* cited by examiner

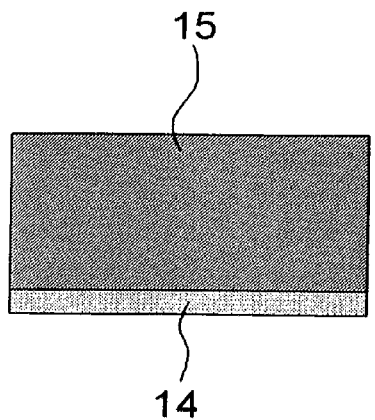
FIG. 19A
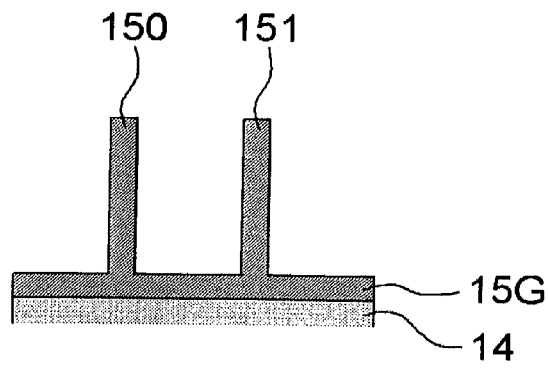
FIG. 19B
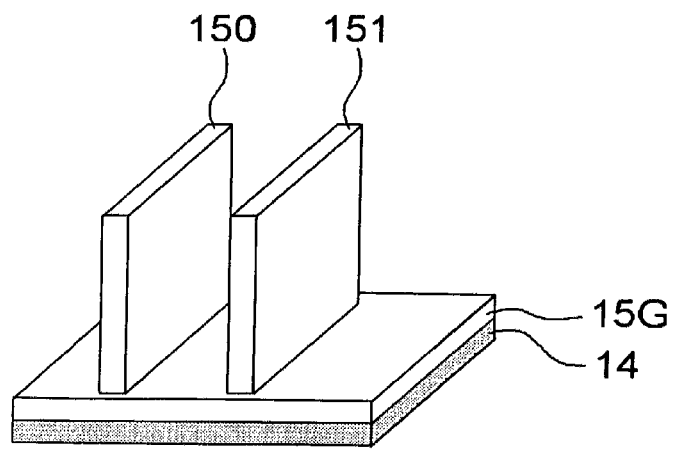
FIG. 19C
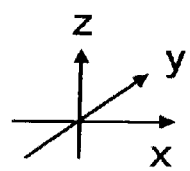

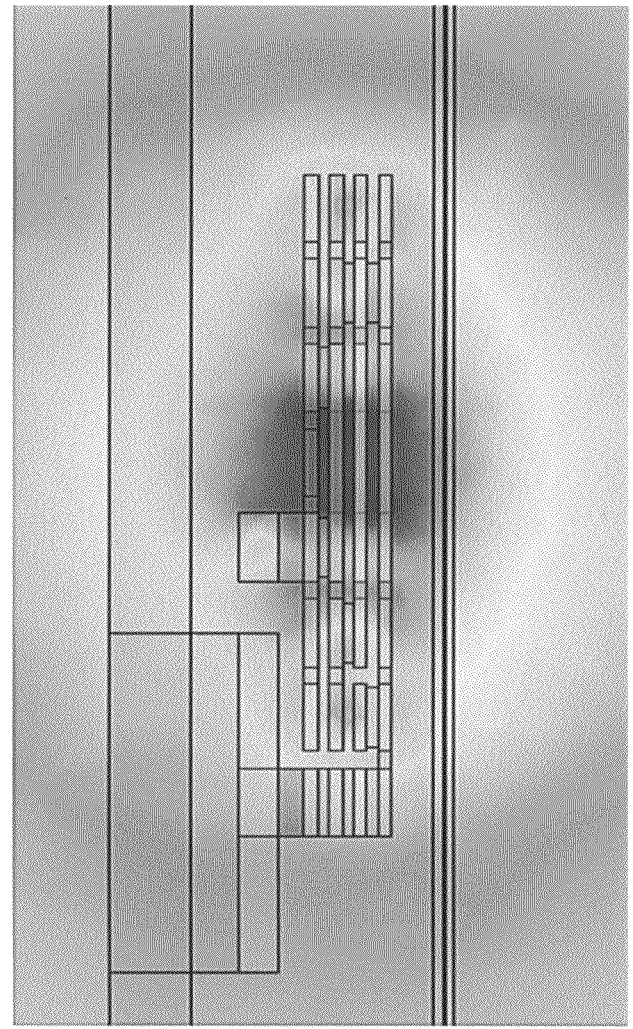
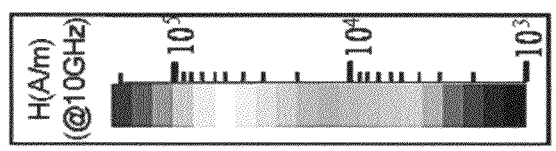
FIG.37

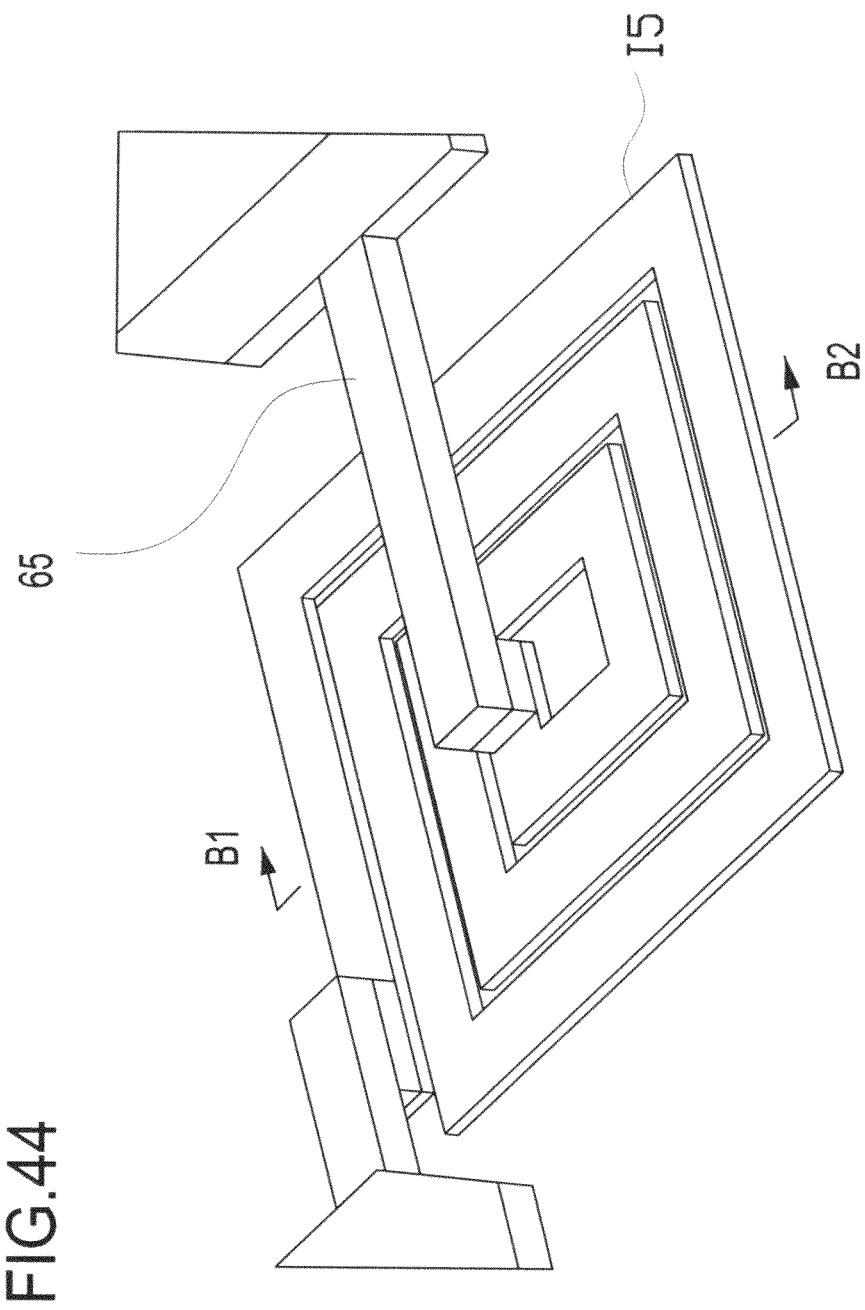

US 8,835,190 B2

SEMICONDUCTOR APPARATUS

The present application is a Continuation Application of U.S. patent application Ser. No. 12/453,037, filed on Apr. 28, 2009, which is based on and claims priority from Japanese patent application Nos. 2008-121527, filed on May 7, 2008 and 2008-249189, filed on Sep. 26, 2008, the entire contents of which are incorporated herein by reference.

BACKGROUND

1. Technical Field

The present invention relates to a semiconductor apparatus having a magnetic shielding film and to a method for manufacturing the semiconductor apparatus.

2. Related Art

In the trends of miniaturization and improved performances of electronic devices in recent years, enhancements in the response speed of semiconductor apparatus such as large scale integrated circuit (LSI) incorporated in these electronic devices are required. In order to meet such requirements, operating frequency of the semiconductor apparatus is increased, resulting in an increased frequency of signal that is propagated through interconnects of the semiconductor apparatus. This causes generation of electromagnetic radiation noises, thereby causing a problem of inducing electromagnetic interferences to other electronic devices. On the contrary, miniaturizations in the electric wiring configurations of the semiconductor apparatus causes considerable noise generated between adjacent interconnects (interconnect crosstalk), causing a problem of inducing malfunctions of the semiconductor apparatus. Therefore, in order to ensure higher reliability of semiconductor apparatus, it is desirable to reduce electromagnetic radiation noise so long as I am possible.

An approach of utilizing magnetic loss of magnetic material is well known as a procedure for reducing electromagnetic radiation noise. For example, Japanese Patent Application Publication No. H06 (1994)-21060 discloses a semiconductor device having a multiple-layered interconnect structure including a ferrimagnetic material film. In the multiple-layered interconnect structure, an interconnect layer, an interlayer insulating film, a ferrimagnetic material film, an interlayer insulating film and an interconnect layer are formed on the semiconductor substrate in this sequence. The ferrimagnetic material film is disposed between one interconnect layer and the other interconnect layer to exhibit an electromagnetic shield function. On the other hand, Japanese Patent Application Publication No. H09 (1997)-330929 discloses a semiconductor device having a layer of a magnetic material formed on an insulating layer including a metallic interconnect layer. Japanese Patent Application Publication No. H06 (1994)-120027 discloses a structure including a FeCo ferromagnetic thin film having positive magnetostriction and an intermediate layer composed of an RFeCo alloy thin film having negative magnetostriction or a spinel ferrite magnetic thin film deposited thereon. The deposited structure allows reducing effective magnetostriction in the whole film.

However, when a semiconductor device includes a film of a magnetic material, a metallic material of this film of the magnetic material may be diffused, considerably deteriorating electrical characteristics of the semiconductor device. The reason for the deterioration is considered that the diffusion of the materials composing the magnetic film is promoted during the manufacturing processes for the semiconductor device, reaching to the interconnect layer to cause a contamination with a metal. For example, in the multiple-layered interconnect structure disclosed in Japanese Patent Application Publication No. H06-21060, the material from the ferrimagnetic material film may be diffused through the interlayer insulating film during manufacturing process to cause a fear for creating contamination with metal.

SUMMARY

According to one aspect of the present invention, there is provided a semiconductor apparatus which includes: a substrate; a semiconductor device formed on a principal surface of the substrate and including an interconnect layer; a magnetic shielding film of a magnetic material covering the semiconductor device; and a buffer film disposed between the semiconductor device and the magnetic shielding film, and preventing diffusion of the magnetic material of the magnetic shielding film.

According to another aspect of the present invention, there is provided a method for manufacturing a semiconductor apparatus. The method includes the steps of: forming a semiconductor device on a principal surface of a substrate, the semiconductor device including an interconnect layer; forming a buffer film which covers the semiconductor device and prevents diffusion of a magnetic material; and forming a magnetic shielding film which covers the buffer film and is composed of the magnetic material.

As described above, the buffer film is present between the semiconductor device and the magnetic shielding film in the semiconductor apparatus according to aspects of the present invention. This buffer film prevents diffusion of the magnetic material from the magnetic shielding film into the semiconductor device, thus preventing contamination with metal.

Therefore, the semiconductor apparatus and the method for manufacturing the semiconductor apparatus are provided to be capable of preventing diffusion of the magnetic material from the magnetic shielding film into the semiconductor device and thus preventing contamination with metal. The buffer film enables improvement of the magnetic characteristics as well as preventing the diffusion of the magnetic material of the magnetic shielding film, as described later in detail.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 19A is a diagram schematically illustrating a magnetic shielding structure;

FIG. 19B is a diagram schematically illustrating an example of a magnetic nanowire configuration; and FIG. 19C is a perspective view of the magnetic nanowire configuration shown in FIG. 19B;

FIG. 37 is a diagram showing results of simulations by disposing a magnetic shielding film on the inductor shown in FIG. 34;

FIG. 44 is a perspective view of a flat spiral inductor;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will be described in reference to the annexed figures as follows.

First Embodiment

Figure 1:
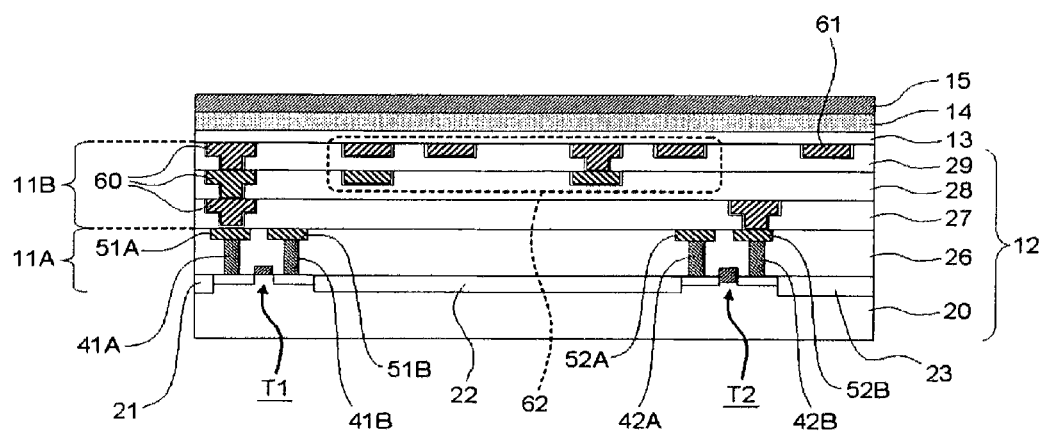
FIG. 1 is a diagram schematically illustrating a cross-sectional structure of a semiconductor apparatus of first embodiment according to the present invention.

FIG. 1 is a diagram, which schematically represents a cross-sectional structure of a semiconductor apparatus 10 of first embodiment according to the present invention. As shown in FIG. 1, the semiconductor apparatus 10 includes a semiconductor substrate 20, a semiconductor device 12 formed on a principal surface of the semiconductor substrate 20 and containing an interconnect layer, a magnetic shielding film 15 of a magnetic material and covering a top upper surface of the semiconductor device 12, and a buffer film 14 disposed between the semiconductor device 12 and the magnetic shielding film 15 and preventing diffusion of the magnetic material of the magnetic shielding film 15. The magnetic material composing the magnetic shielding film 15 is a soft magnetic ferromagnetic material. An insulating film (dielectric film) 13 is formed between the semiconductor device 12 and the buffer film 14.

The semiconductor device 12 in first embodiment includes transistors T1 and T2 formed on the semiconductor substrate 20. Each of the transistors T1 and T2 is an n-type or a p-type metal oxide semiconductor (MOS) transistor having a gate electrode, a source diffusion region and a drain diffusion region. Transistor T1 is isolated from the other elements by the presence of element isolation regions 21 and 22 such as shallow trench isolation (STI), and the transistor T2 is also isolated from the other element by the presence of element isolation regions 22 and 23 such as STI. A first interlayer insulating film 26 is formed on the transistors T1 and T2. The first interlayer insulating film 26 is provided with a contact plug 41A coupled to one of the source diffusion region or the drain diffusion region of the transistor T1, and a contact plug 41B coupled to the other one of the source diffusion region or the drain diffusion region of the transistor T1. An electrically conducting layer 51A is formed on the contact plug 41A, and an electrically conducting layer 51B is formed on the contact plug 41B. The first interlayer insulating film 26 is further provided with a contact plug 42A coupled to one of the source diffusion region or the drain diffusion region of the transistor T2, and a contact plug 42B coupled to the other one of the source diffusion region or the drain diffusion region of the transistor T2. An electrically conducting layer 52A is formed on the contact plug 42A, and an electrically conducting layer 52B is formed on the contact plug 42B. The transistors T1 and T2, the contact plugs 41A, 41B, 42A and 42B, and the first interlayer insulating film 26 compose the transistor layer 11A.

A second interlayer insulating film 27, a third interlayer insulating film 28 and a fourth interlayer insulating film 29 are deposited on the transistor layer 11A. Buried interconnect 60 and 61 are formed in the second interlayer insulating film 27, the third interlayer insulating film 28 and the fourth interlayer insulating film 29 by, for example, a damascene process (single damascene process or dual damascene process). More specifically, a trench is formed in the second interlayer insulating film 27 via a photolithographic process, and then a barrier metal and a copper (Cu) seed film are consecutively formed in the trench via a sputter process. Subsequently, a Cu film is grown in the interior of the trench via an electrolytic plating process to fill the trench with the Cu film. Thereafter, an excessive portion of the Cu film is removed via a chemical mechanical polishing (CMP) process. This provide a formation of buried interconnects 60 in the second interlayer insulating film 27. After the CMP process, a thermal treatment at a temperature of 200 to 400 degrees Centigrade is conducted for stabilizing grains in the formed Cu film.

The buried interconnects may also be formed in the third interlayer insulating film 28 and in the fourth interlayer insulating film 29 by the similar process The buried interconnects that constitutes an inductor 62 are formed in the third interlayer insulating film 28 and the fourth interlayer insulating film 29. The second interlayer insulating film 27, the third interlayer insulating film 28 and the fourth interlayer insulating film 29 constitutes a multiple-layered interconnect layers 11B. The multiple-layered interconnect layers 11B are electrically mutually coupled with the transistor layer 11A through the contact plugs 41A, 41B, 42A and 42B composed of tungsten (W) or the like.

In addition to above, the first to the fourth interlayer insulating films 26 to 29 may be preferably composed of a low dielectric constant material (low-k material). Typical low dielectric constant materials include, for example, silicon oxycarbide (SiOC), silicon carbide (SiC), fluorinated silicon oxide (SiOF), porous silicon dioxide (porous $SiO_2$) and porous SiOC.

Figure 2A:
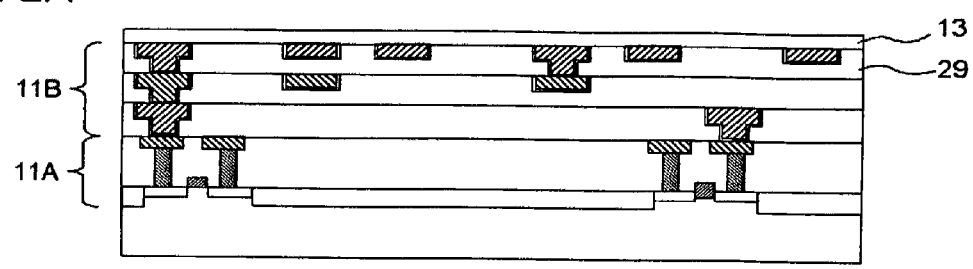
FIGS. 2A and 2B are cross-sectional views, illustrating a process for manufacturing a semiconductor apparatus of first embodiment.

The process for manufacturing the semiconductor apparatus 10 will be described as follows, in reference to FIG. 2A and FIG. 2B. As shown in FIG. 2A, an insulating film 13 for a cap for the interconnects is formed on the multiple-layered interconnect layer 11B of the semiconductor device, for the purposes of prevention for oxidation of Cu and prevention for diffusion of Cu. Typical materials for the insulating film 13 preferably include, for example, $SiO_2$, silicon nitride (SiN), or silicon carbonitride (SiCN). Alternatively, the insulating film 13 may be composed of multiple-layered insulating films having a hard mask insulating film or an insulating film for passivation.

Figure 2B:
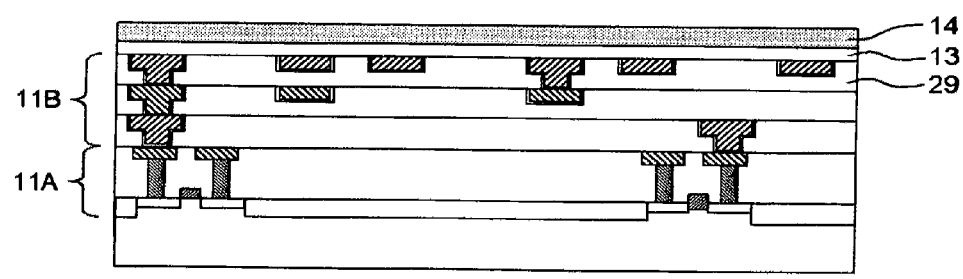

Then, as shown in FIG. 2B, a buffer film 14 is formed on the insulating film 13 via, for example, a DC sputter process. Subsequently, a magnetic shielding film 15 is formed on the buffer film 14 via, for example, radio frequency (RF) magnetron sputter process. Here, an upper limit of the process temperature during the process for forming the magnetic shielding film 15 may be set to fall within a range of from 300 to 400 degrees Centigrade according to the upper limit of the process temperature for forming the multiple-layered interconnect layers 11B.

Ferrite having a spinel-type crystal structure (spinel ferrite) may be employed for the magnetic material that composes the magnetic shielding film 15. Spinel ferrite contains as a main component at least one of oxide magnetic materials consisting of $XFe_2O_4$ and $Y_{1-n}Z_nFe_2O_4$. Here, X is a chemical element selected from a group consisting of nickel (Ni), zinc (Zn), copper (Cu), cobalt (Co), manganese (Mn) and iron (Fe). Y is a chemical element selected from a group consisting of Ni, Zn, Cu, Co and Mn, and Z is a chemical element selected from a group consisting of Ni, Zn, Cu, Co and Mn.

It may be sufficient that the buffer film 14 is a refractory metal film of a chemical element selected from a group consisting of tungsten (W), tantalum (Ta), titanium (Ti) and ruthenium (Ru), or is an alloying film of at least a chemical element selected from a group consisting of W, Ta, Ti and Ru. Alternatively, the buffer film 14 may be a nitride film of at least a chemical element selected from a group consisting of W, Ta, Ti and Ru, or an oxide film of the above-described chemical elements. The buffer film 14 may have a structure of deposited layers consisting of a plurality of films selected from group consisting of the aforementioned refractory metal film, the aforementioned alloy film, the aforementioned oxide film and the aforementioned nitride film (for example, Ti/TiN film or Ta/TaN film).

The buffer film 14 functions as preventing diffusion of the magnetic material of the magnetic shielding film 15 into the semiconductor device 12. In particular, the aforementioned nitride film is preferably employed, in terms of a prevention of the diffusion of the magnetic material. Here, it may be sufficient that the buffer film 14 has a thickness that is sufficient to prevent diffusion of the materials composing the magnetic shielding film 15. On the other hand, it may be desirable that the thickness of the buffer film 14 is not larger than 20 nm. This allows the sheet resistance of the buffer film 14 to be not excessively decreased, resulting in a prevention for a decrease of eddy current loss.

Furthermore, a use of the buffer film 14 allows improvements in the magnetic characteristics of magnetic shielding film 15. More specifically, even if the upper limit of the process temperature for the semiconductor apparatus 10 is set within a range of from 350 to 400 degrees Centigrade in consideration of lower heat resistance of the interlayer insulating films 26 to 29 that constitute the semiconductor device 12, spinel ferrite film having higher crystallinity can be formed on the buffer film 14. This allows obtaining higher magnetic shielding effect.

In addition to above, the term "magnetic shielding effect" in this Description indicates an effect for enhancing the magnetic flux density to improve the inductor performances by utilizing real number component of a permeability of the magnetic material, a magnetic loss due to a magnetic resonance by utilizing imaginary number component of the permeability, or an effect for reducing electromagnetic noise by utilizing the eddy current loss.

Measurement results of various characteristics of the magnetic shielding film 15 composed of Ni—Zn spinel ferrite ($Ni_{1-n}Zn_nFe_2O_4$) will be described as follows. The buffer film 14 was formed via a DC sputter process, and a magnetic shielding film 15 was deposited on the buffer film 14 via RF sputter process utilizing a target materials of $Ni_{0.5}Zn_{0.5}Fe_2O_4$. Conditions for the deposition of the Ni—Zn spinel ferrite (hereinafter simply referred to as "Ni—Zn ferrite") were: pressure in a chamber of 3.2 mtorr; RF power of 3 kW; and gaseous species introduced in the chamber of argon (Ar) gas and oxygen ($O_2$) gas.

Figure 3:
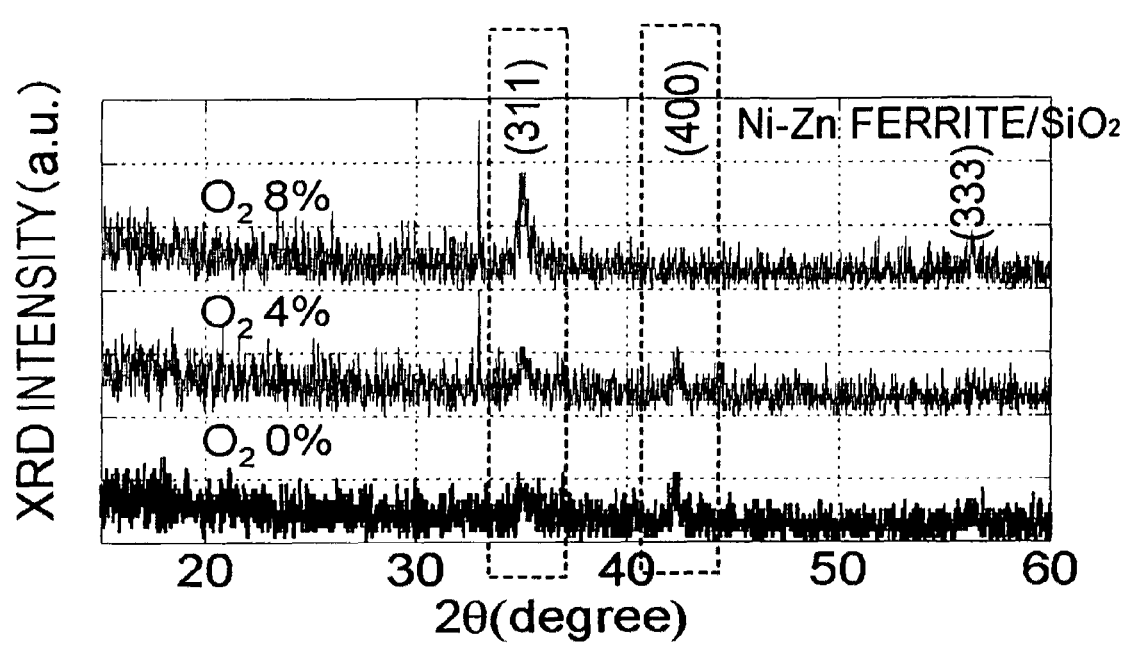
FIG. 3 is a graph showing X-ray diffraction data.
Figure 4:
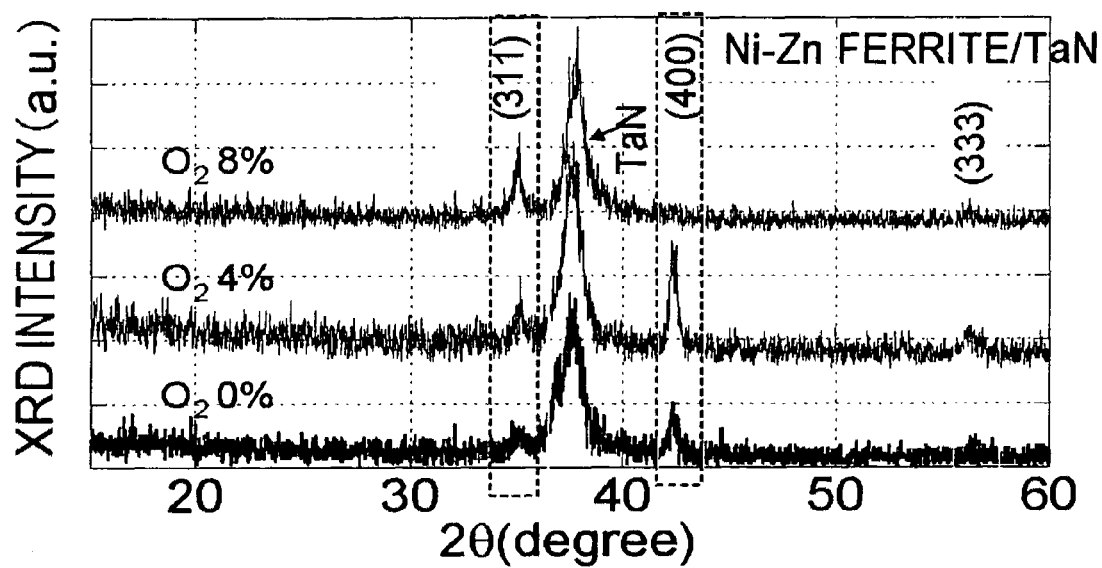
FIG. 4 is a graph showing X-ray diffraction data.

FIG. 3 and FIG. 4 are graphs, showing data of x-ray diffraction (XRD) in the case that a Ni—Zn ferrite film having a thickness of 200 nm is formed on the buffer film 14 having a thickness of 100 nm as the magnetic shielding film 15. Abscissa axis of the graph represents scattering angle 2θ (unit of θ is degree; θ is Bragg reflection angle), and ordinate axis represents XRD intensity by an arbitrary unit (a.u.). Measured values under the conditions that the concentration of oxygen introduced in the deposition process was 0%, 4% and 8% are plotted in these graphs. The graph of FIG. 3 is a graph in the case that the buffer film 14 is composed of amorphousness oxidized silicon ($SiO_2$) (Ni—Zn ferrite/$SiO_2$ deposited structure), and the graph of FIG. 4 is a graph in the case that the buffer film 14 is composed of tantalum nitride (TaN) (Ni—Zn ferrite/TaN deposited structure).

In the graphs of FIG. 3 and FIG. 4, intensities for the (311) crystal face, the (400) crystal face and the (333) crystal face of the Ni—Zn ferrite film are observed. In particular, it can be seen that the intensity of (311) crystal face under the condition of the oxygen concentration of 8% is very high, and the orientation of the (400) crystal face is considerably exhibited under the condition of the oxygen concentration of 4%.

Figure 5:
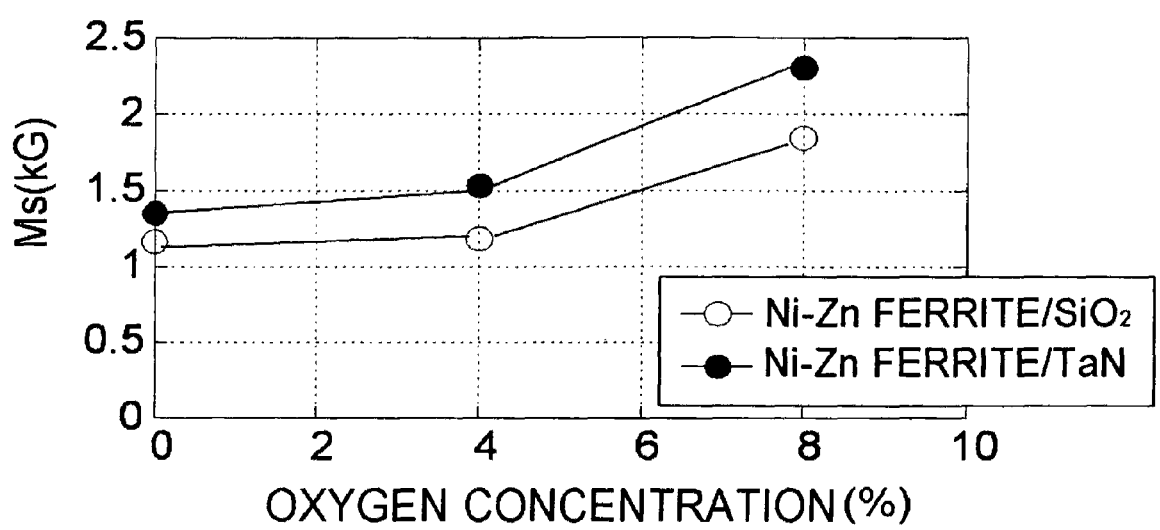
FIG. 5 is a graph showing oxygen concentration dependency of saturation magnetization.

FIG. 5 is a graph, showing oxygen concentration-dependency of saturated magnetization related to the above-described Ni—Zn ferrite. Abscissa axis of the graph of FIG. 5 represents the oxygen concentration (unit: %) during the deposition process, and ordinate axis represents the saturation magnetization (Ms) (unit: Kg). According to the graphs of FIG. 3 to FIG. 5, it can be seen that a positive correlation is present between the (311) crystal face intensity and the saturated magnetization (Ms).

Figure 6:
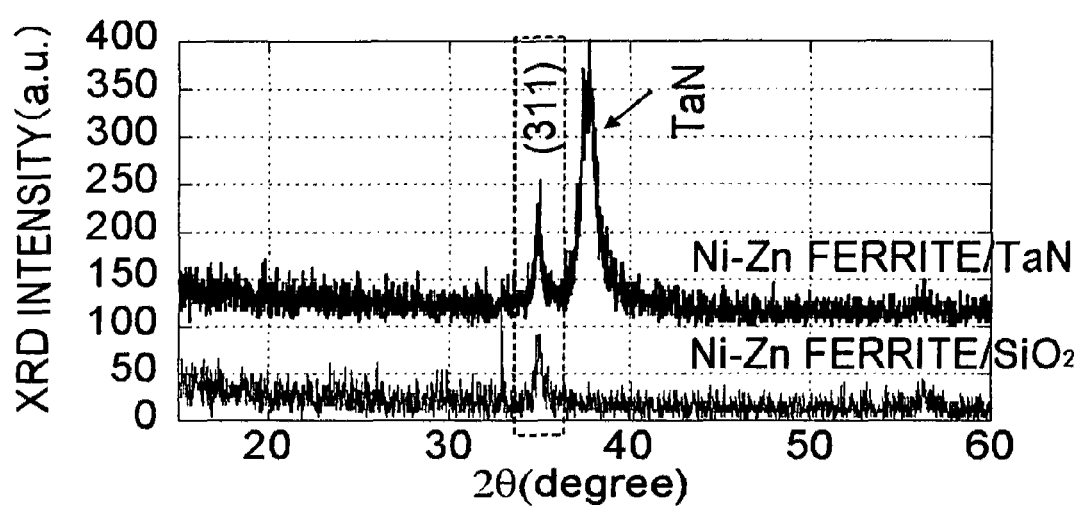
FIG. 6 is a graph showing X-ray diffraction data.

FIG. 6 is a graph, representing XRD data in the case that the oxygen concentration was 8%, which is extracted from FIG. 3 and FIG. 4. According to the graph of FIG. 5, it can be understood that the intensity of the (311) crystal face of the Ni—Zn ferrite film formed on the TaN film is considerably stronger, as compared with that of the Ni—Zn ferrite film formed on the amorphous silicon oxide film. The reason is considered that the lattice match capability between the most orientated face of the TaN film and the most oriented face (= the (311) crystal face) of the Ni—Zn ferrite film is better, so that the (311) crystal face is easily grown on the TaN film via the RF sputter process.

Figure 7:
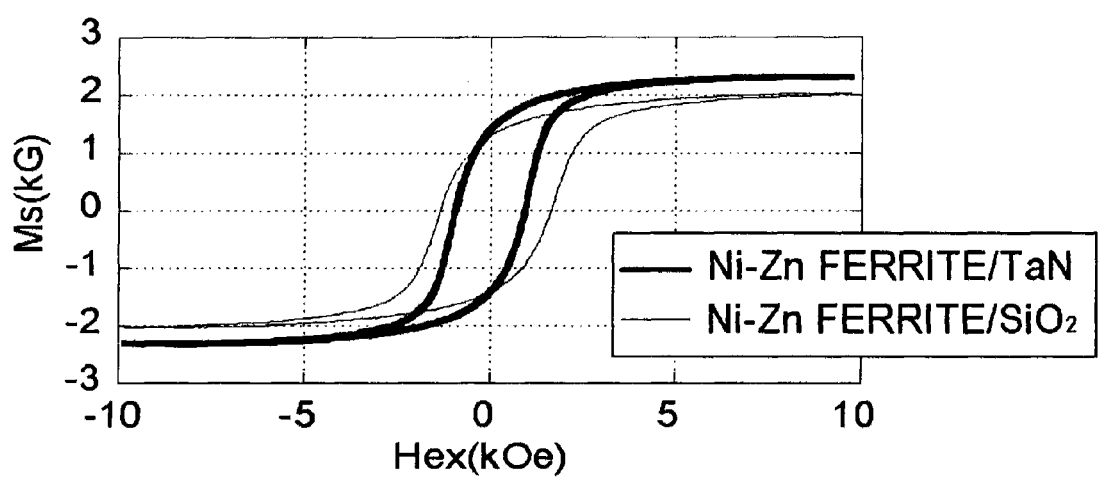
FIG. 7 is a graph showing measurement results of magnetic hysteresis of multiple-layered structures of Ni—Zn ferrite/TaN and Ni—Zn ferrite/$SiO_2$.

Measurement results of magnetic hysteresis for two multiple-layered structures that are Ni—Zn ferrite/TaN and Ni—Zn ferrite/$SiO_2$ having crystallinity shown in FIG. 6 are shown in graph of FIG. 7. Abscissa axis of the graph represents external magnetic field Hex (unit: KOe), and ordinate axis represents magnetized Ms (unit: KG). It can be understood according to the graph of FIG. 7 that, when the intensity of the (311) crystal face is increased due to high crystallization of Ni—Zn ferrite, the saturation magnetization is increased, the coercive force is reduced, and the permeability is increased. In addition, the film defects are also decreased. Therefore, in particular, the use of TaN film for the buffer film 14 allows increased crystallization of Ni—Zn ferrite and enhanced magnetic shielding effect.

Figure 8:
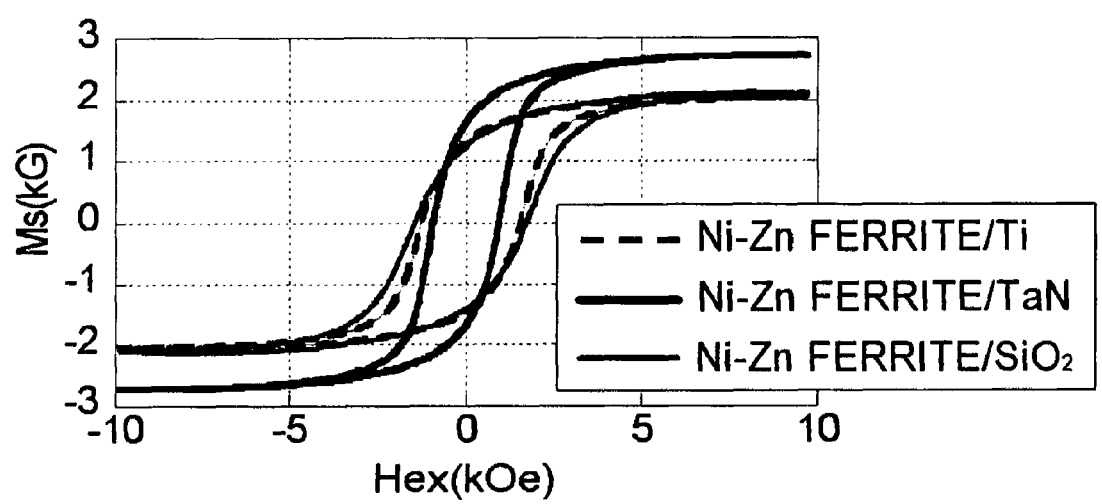
FIG. 8 is a graph showing measurement results of magnetic hysteresis of a multiple-layered structure of Ni—Zn ferrite/Ti.

FIG. 8 represents a graph showing measurement results of the magnetic hysteresis for multiple-layered structure of Ni—Zn ferrite/Ti. The measurement results of FIG. 7 are also included in the graph of FIG. 8. According to the graph of FIG. 8, the saturation magnetization of Ni—Zn ferrite/Ti layered structure is substantially the same as that of Ni—Zn ferrite/$SiO_2$ layered structure. On the other hand, it can be understood that the coercive force of the Ni—Zn ferrite/Ti layered structure is slightly larger than that of the Ni—Zn ferrite/$SiO_2$ layered structure, and the permeability of the Ni—Zn ferrite/Ti layered structure is higher than that of the Ni—Zn ferrite/$SiO_2$ layered structure.

Figure 9:
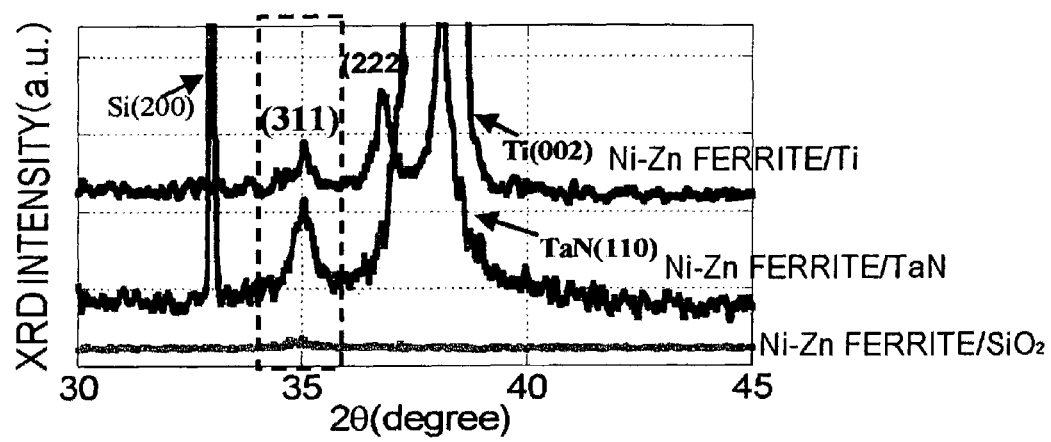
FIG. 9 is a graph showing X-ray diffraction data.

FIG. 9 is a graph showing XRD data, in the case that the Ni—Zn ferrite film having a thickness of 200 nm is formed on the buffer film 14 composed of 100 nm-thick Ti as the magnetic shielding film 15. The oxygen concentration during the deposition process is 8%. The graph of FIG. 9 additionally includes the measurements result of FIG. 6 for the comparison. A growth of the (222) crystal face of the Ni—Zn ferrite film, which is not found on the amorphousness silicon oxide film or the TaN film is found on the Ti film, presenting the most oriented face. It is also understood that the growing face of the Ni—Zn ferrite film is different by the crystal structure of the buffer film.

Figure 10:
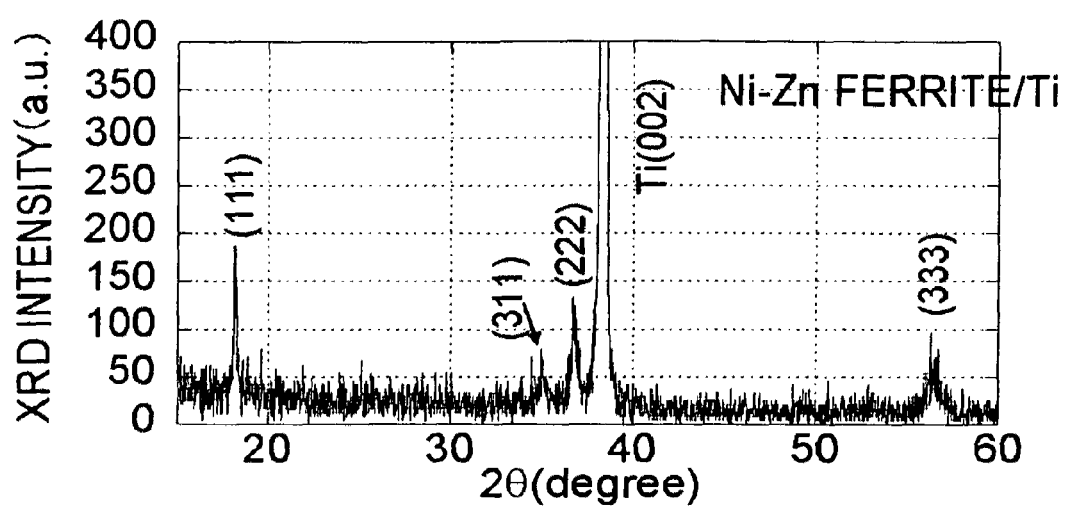
FIG. 10 is a graph showing X-ray diffraction data.

Next, the cases of employing the TaN film, the Ru film and the Ti film as the buffer film 14 are mutually compared. FIG. 10 is a graph showing XRD data, in the case that the Ni—Zn ferrite film having a thickness of 200 nm is formed on the buffer film 14 composed of 100 nm-thick Ti as the magnetic shielding film 15. FIG. 10 is a graph showing XRD data, in the case that the Ni—Zn ferrite film having a thickness of 200 nm is formed on the buffer film 14 composed of 100 nm-thick Ru as the magnetic shielding film 15. Then, FIG. 12 is a graph showing XRD data, in the case that the Ni—Zn ferrite film having a thickness of 200 nm is formed on the buffer film 14 composed of 100 nm-thick TaN as the magnetic shielding film 15. In all cases of FIG. 10, FIG. 11 and FIG. 12, oxygen concentration during the deposition processes are 8%.

In reference to FIG. 10, it can be seen that orientations of the (111) crystal face, the (222) crystal face and the (333) crystal face are caused in the Ni—Zn ferrite film. It is considered that this is because the orientation the Ni—Zn ferrite is caused in the (111) crystal face, the (222) crystal face and the (333) crystal face due to the crystal structure of the (002) crystal face of Ti film. As described above, the orientation face of the Ni—Zn ferrite can be controlled by suitably controlling the crystal structure of the buffer film 14. The crystal structure of the buffer film 14 is suitably controlled to control the orientation face of the magnetic shielding film 15, so that higher electromagnetic noise restraint effect suitable for the frequency of the electromagnetic noise and the direction of the propagation of the electromagnetic noise can be achieved.

As shown in FIG. 4, when the Ni—Zn ferrite film is formed on the TaN film and the oxygen concentration in a deposition processed is set as 0% or 4%, an orientation of the (400) crystal face is observed in the Ni—Zn ferrite film. However, when the oxygen concentration in the deposition is set as 8%, no orientation of the (400) crystal face is observed in Ni—Zn ferrite film. It can be presumed that this is because the distribution of oxygen ions occupying the crystal lattice of Ni—Zn ferrite and/or the atomic value of iron are affected by the oxygen concentration to change the crystal structure of Ni—Zn ferrite.

Figure 11:
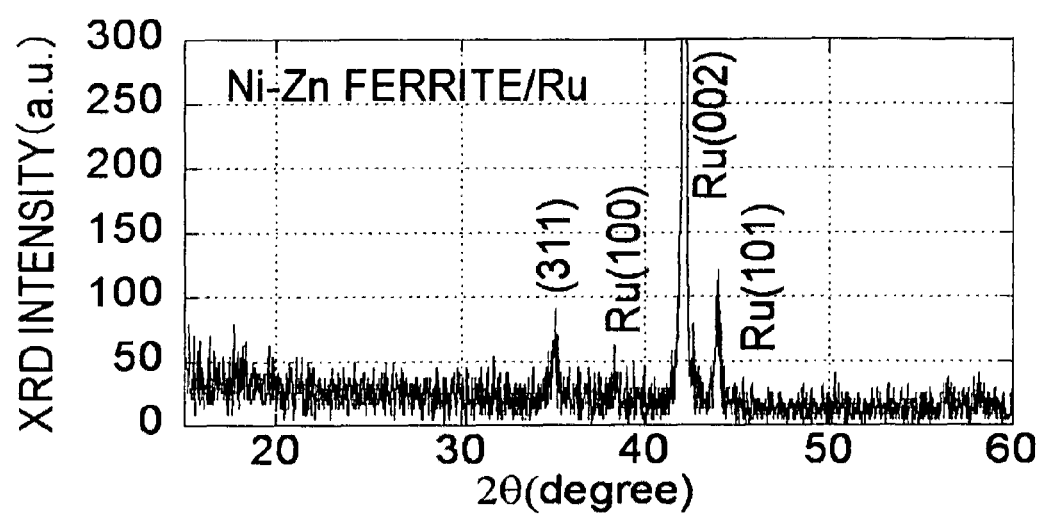
FIG. 11 is a graph showing Xray diffraction data.
Figure 12:
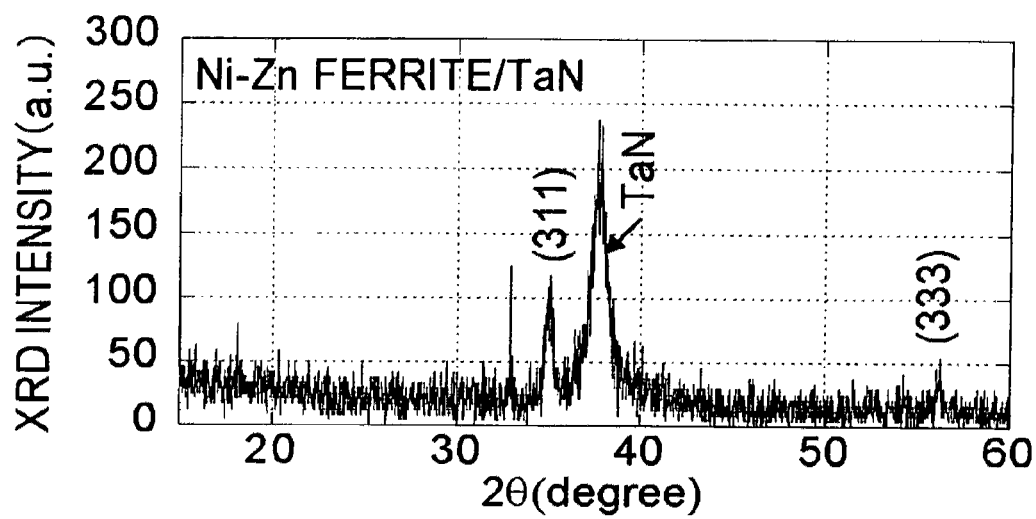
FIG. 12 is a graph showing X-ray diffraction data.

In reference to FIGS. 11 and 12, the (311) crystal face intensity of the Ni—Zn ferrite film formed on the TaN film is higher than the (311) crystal face intensity of the Ni—Zn ferrite film formed on the Ru film. Thus, it can be seen that the Ni—Zn ferrite film formed on the TaN film is highly crystallized.

Figure 13:
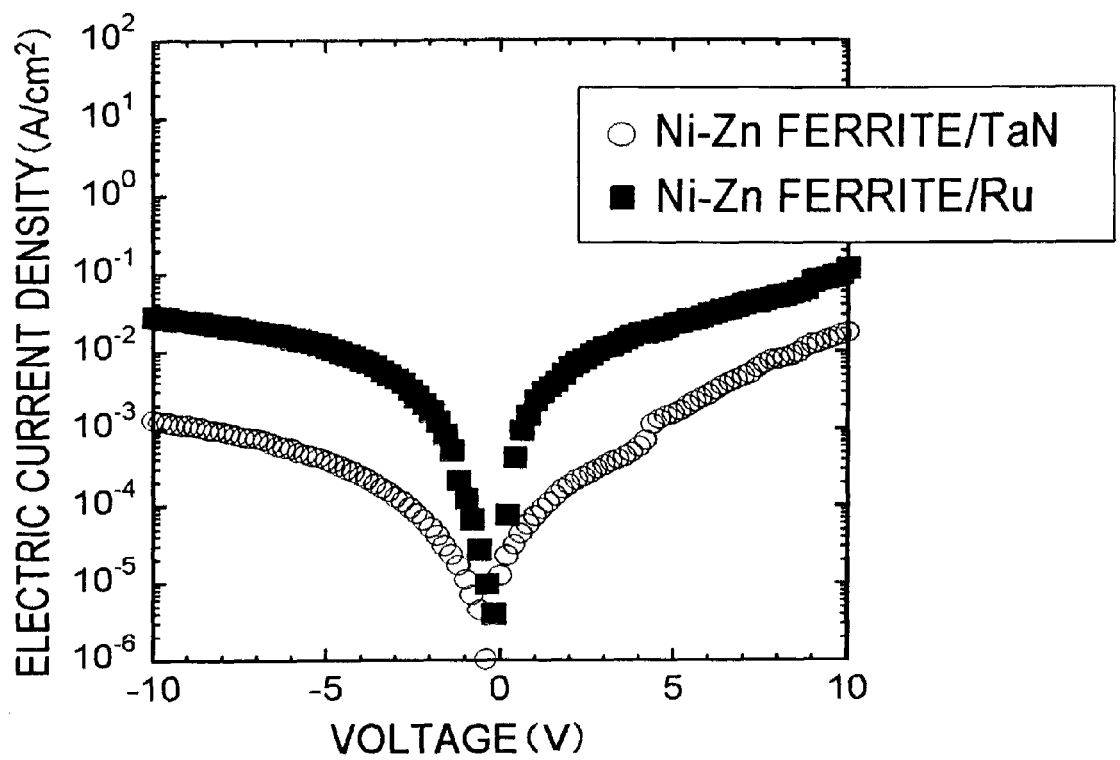
FIG. 13 is a graph showing current-voltage characteristics of multiple-layered structures that are Ni—Zn ferrite/Ru and Ni—Zn ferrite/TaN, which are the objects of the measurement in FIG. 11 and FIG. 12.

FIG. 13 is a graph, showing current-voltage characteristics of two multiple-layered structures that are Ni—Zn ferrite/Ru and Ni—Zn ferrite/TaN, which are the objects of the measurement in FIG. 11 and FIG. 12. According to the graph of FIG. 13, the electrical resistivity of the Ni—Zn ferrite film formed on the TaN film is about $1.6 \times 10^6$ $\Omega$/cm when the applied voltage is 3 V, and the electrical resistivity of the Ni—Zn ferrite film formed on the Ru film is about $5.3 \times 10^6$ $\Omega$/cm. Thus, the use of the TaN film allows achieving the above-described higher crystallization due to the (311) crystal face orientation and reduced eddy current loss by the increased resistance. Thus, it can be considered that the crystal structure of the buffer film 14 and the condition of the oxygen concentration in the deposition process for the Ni—Zn ferrite film are suitably adjusted to appropriately control the crystal orientation and the crystallinity of the Ni—Zn ferrite film. Further, since the electrical resistivity of the Ni—Zn ferrite film is expected to be dependent upon the crystal structure of the buffer film 14, the crystallinity the crystal orientation and the eddy current loss of Ni—Zn ferrite film can be suitably adjusted to control the magnetic shielding effect.

Figure 14:
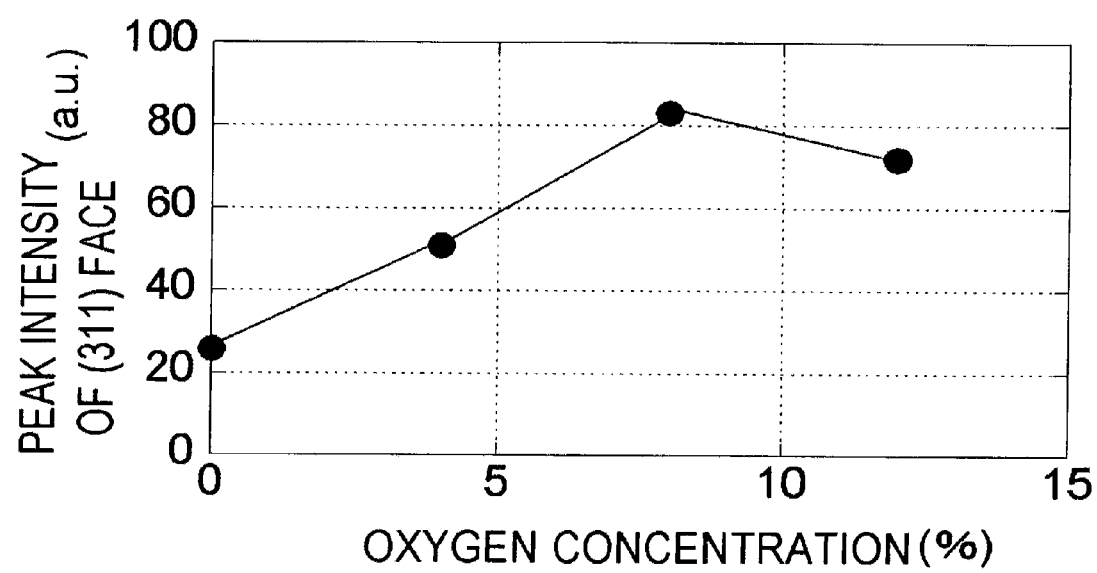
FIG. 14 is a graph showing relations between the oxygen concentration in the deposition process for the Ni—Zn ferrite film and the XRD peak intensity of the (311) crystal face of the Ni—Zn ferrite film.
Figure 15:
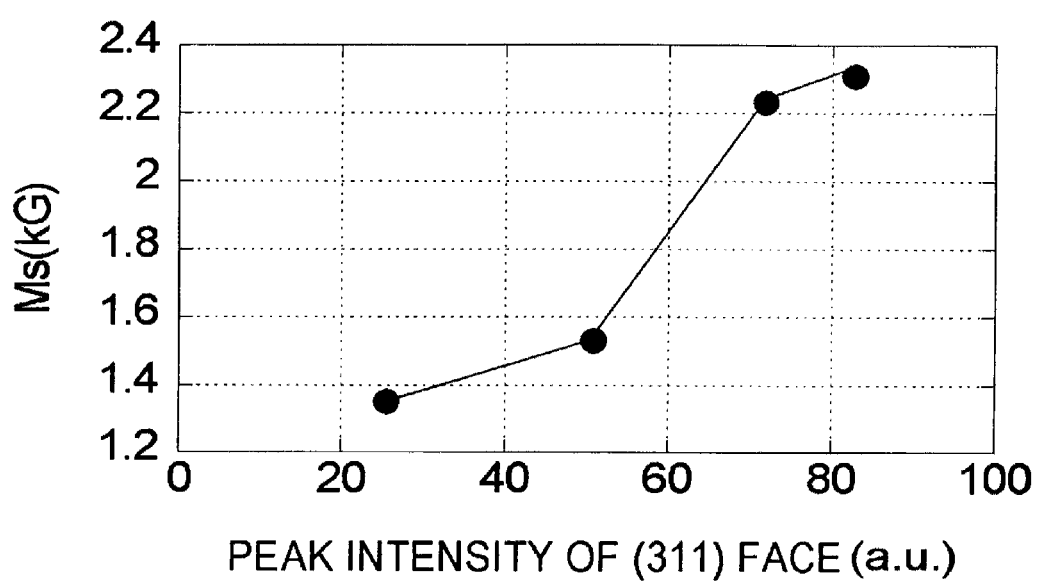
FIG. 15 is a graph showing relations between the XRD peak intensity of the (311) crystal face and the saturation magnetization Ms.

FIG. 14 is a graph; showing relations between the oxygen concentration in the deposition process for the Ni—Zn ferrite film and the XRD peak intensity of the (311) crystal face of the Ni—Zn ferrite film, when the Ni—Zn ferrite/TaN layered structure is formed. FIG. 15 is a graph, showing relations between the XRD peak intensity of the (311) crystal face and the saturation magnetization Ms. According to the graph of FIG. 14, the growth of the (311) crystal face is not promoted by the influence of the oxygen deficit at the oxygen concentration of smaller than 8%, resulting in lower peak intensity. Further, it can also be understood that larger concentration further from 8% creates excessive oxygen, causing a reduced peak intensity of the (311) crystal face. It can be understood from the graph that, in view of obtaining higher crystallization by the orientation of the (311) crystal face, it is desirable to employ the oxygen concentration from about 6% to 12% under the chamber interior pressure of the reactive gases composed of argon and oxygen of 3.2 mtorr. The control of the concentration of oxygen that is the reactant gas is essential for the crystallization of Ni—Zn ferrite by employing RF magnetron sputter process.

According to the graph of FIG. 15, a positive correlation is present between the intensity of (311) crystal face and the saturation magnetization Ms, and the growth of the (311) crystal face of the Ni—Zn ferrite on the TaN film leads to higher crystallization of the Ni—Zn ferrite film, as well as an improvement in the magnetic characteristics, leading to improved magnetic shielding effect.

Figure 16:
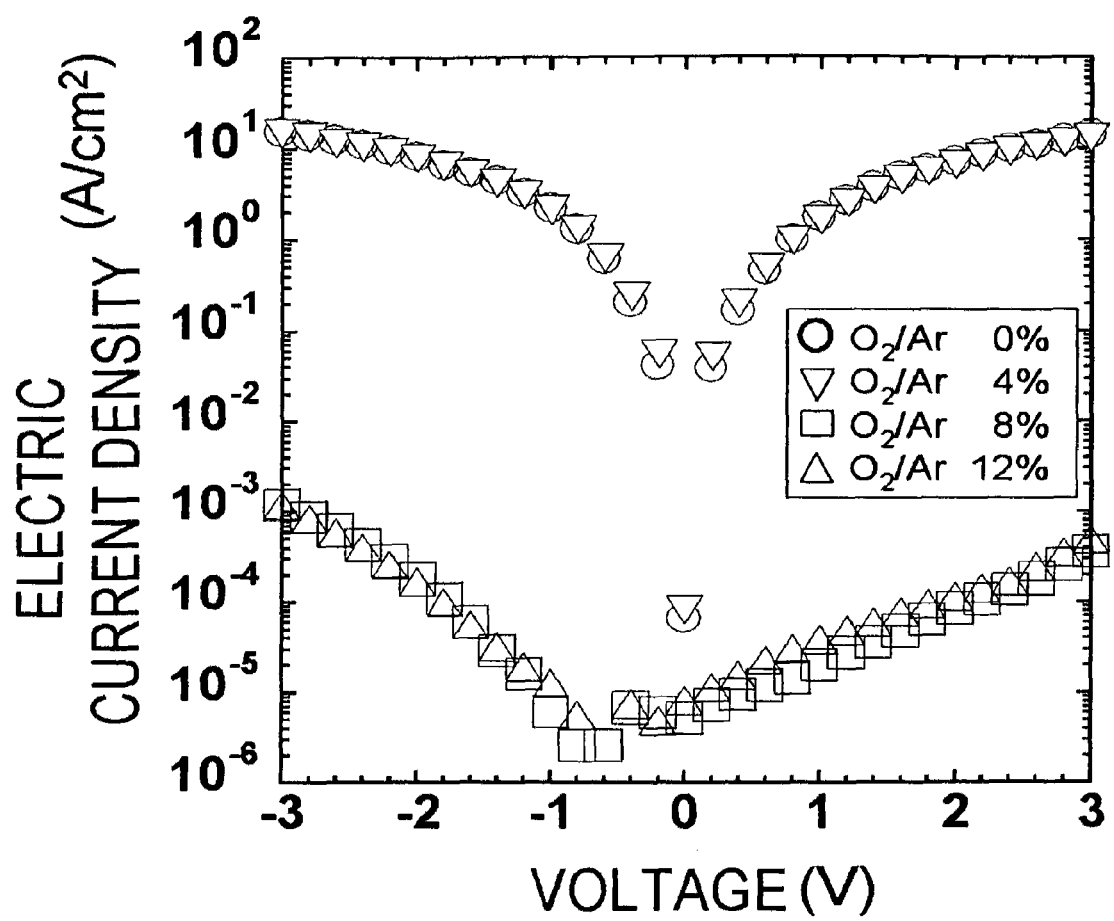
FIG. 16 is a graph showing the current-voltage characteristics of the Ni—Zn ferrite/TaN layered structure.

FIG. 16 is a graph, showing the current-voltage characteristics of the Ni—Zn ferrite/TaN layered structure. This graph contains plots of the measured values when the oxygen concentration in the process for depositing Ni—Zn ferrite film is set as 0%, 4%, 8% and 12%. It is understood according to the graph of FIG. 16 that the Ni—Zn ferrite film exhibits higher resistance under the conditions of the oxygen concentrations of 8% and 12%. All of higher resistance, higher saturation magnetization and higher permeability of the Ni—Zn ferrite film can be achieved in these two conditions. On the other hand, under the conditions of the oxygen concentrations of 0% and 4%, the resistance of the Ni—Zn ferrite film is reduced due to the oxygen deficit. However, since the electrical resistivity of the soft magnetic materials such as permalloy or an amorphousness magnetic material such as CoZrTa is on the order of $10^{-6}$ to $10^{-4}$ $\Omega$/cm, the Ni—Zn ferrite films formed under the conditions of the oxygen concentrations of 0% and 4% have considerably higher electrical resistivity, as compared with the other types of the soft magnetic materials, providing sufficient inhibition of the eddy current loss at higher frequency.

Figure 17:
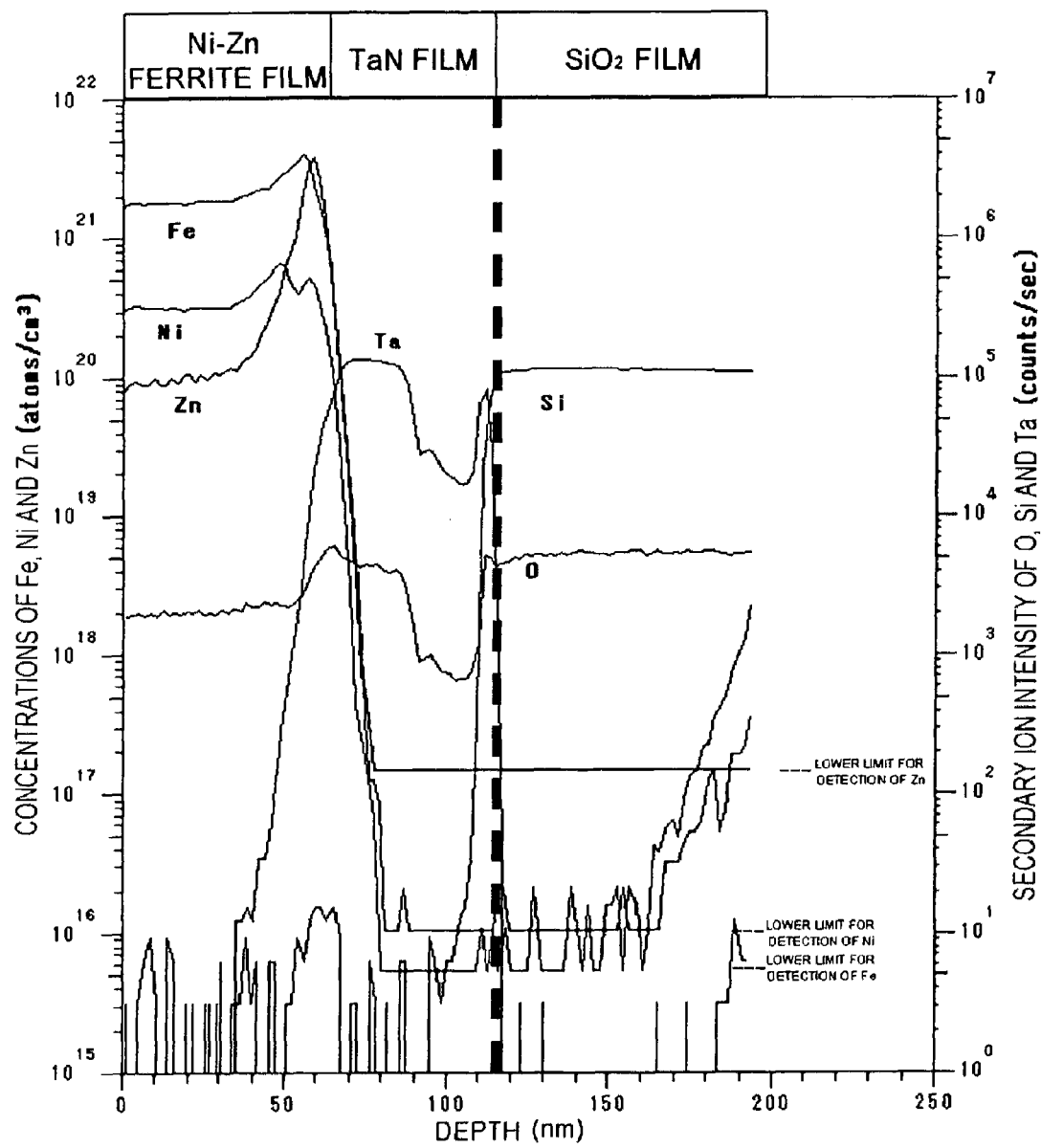
FIG. 17 is a graph showing results of backside SIMS.

Next, effect of the preventing diffusion of the magnetic material is measured, when the TaN film having a thickness of 15 nm is formed as the buffer film 14 on the $SiO_2$ film having a thickness of 100 nm and then the Ni—Zn ferrite film of the thickness of 200 nm is formed as the magnetic shielding film 15 on the TaN film. FIG. 17 is a graph, showing the results of the backside secondary ion mass spectrometry (backside SIMS). In addition to above, the backside SIMS is a spectrometry in the depth direction from the back surface of the sample via SIMS. A sample prepared by annealing a tri-layer structure of Ni—Zn ferrite/TaN/$SiO_2$ at a temperature of 350 degrees Centigrade in an nitrogen atmosphere for seven hours is employed.

In the graphs of FIG. 17, a broken line represents a location of an interface between the TaN film and the $SiO_2$ film. As can be seen from the graph, none of Ni, Zn, and Fe is diffused and entered in the region in the side of the $SiO_2$ film side from the broken line. More specifically, it can be understood that the TaN film functions as a diffusion barrier film. When each of a W film, a Ru film, a Ta film, a Ti film and a TiN film is employed for the buffer film 14, similar effect for preventing the diffusion can be obtained as in the case of employing the TaN film.

The advantageous effects by the semiconductor apparatus 10 of the above-described first embodiment and the process for manufacturing thereof will be described as follows. Since the buffer film 14 functioning as protecting the diffusion of the magnetic material is disposed between the semiconductor device 12 and the magnetic shielding film 15 as shown in FIG. 1, a generation of contamination with metals due to diffusion of the magnetic material in the magnetic shielding film 15 into the semiconductor device 12 is prevented. The buffer film 14 functioning as protecting the diffusion of the magnetic material also provides can also provides improved magnetic characteristics by highly crystallizing the magnetic shielding film formed on the buffer film. Therefore, the magnetic shielding function can be exhibited without deteriorating the electrical characteristics of the semiconductor device 12.

The magnetic shielding film 15 functions as shielding electromagnetic field, which is generated due to a signal propagating through the interconnect of the multiple-layered interconnect layer 11B in the semiconductor device 12. The magnetic flux generated in the inductor 62 can be concentrated on the magnetic shielding film 15 when a electric current signal at higher frequency is flowed through the interconnect that constitutes the inductor 62, improving the inductance L and/or Q factor (quality factor) of the inductor 62. Thus, the increased functions and the miniaturization of the inductor 62 can be achieved. In addition, the inductor of the multiple-layered interconnect structure as described later can be combined with the magnetic shielding structure in first embodiment to achieve the miniaturization of the inductor 62. For example, in RF analog circuits including inductance-capacitance-resistance (LCR) circuit structure, achievement of the increased functions and reduced dimensional area of the inductor is urgently required, as the degree of the integration of the semiconductor chip is increased. The combination of the inductor of the multiple-layered interconnect structure with the magnetic shielding structure in first embodiment can provide increased inductance L without changing the dimension of the inductor, or sufficiently higher inductance L can be obtained even if the inductor is miniaturized.

Furthermore, the spreading of the inducing magnetic flux of inductor 62 is restrained by the magnetic shielding film 15, such that, even if a plurality of inductors are formed in parallel on one semiconductor substrate 20 such as a silicon substrate, the inductive coupling among these inductors is hardly occurred, inhibiting a generation of cross talk. Therefore, a plurality of inductors can be densely arranged in parallel to achieve high density assembly.

It is known that the inductor performances are deteriorated by an eddy current loss of a lower resistance section in the semiconductor substrate 20 such as a silicon substrate. Since the spreading of the inducing magnetic flux of the inductor 62 can be reduced by the above-mentioned magnetic shielding effect, the aforementioned eddy current loss can be reduced to achieve improved magnetic efficiency of the inductor. In addition, improved magnetic flux density in the inductor 62 can be achieved by the magnetic shielding effect, enhancing the inductor performances (inductance or Q factor). Furthermore, the highly resistive oxide magnetic material such as Ni—Zn ferrite and the like is employed for the material composing the magnetic shielding film 15, so that the eddy current loss of the magnetic material itself can be reduced, and further, the magnetic flux density can be enhanced without attenuating the magnetic flux of the inductor 62 even in the higher frequency band like GHz range band.

It is general in the damascene process that the upper limit of the process temperature is set within a range of from 350 to 400 degrees Centigrade, in consideration of the lower heat resistance of the interlayer insulating film. The reason is that relatively weak bonding force of atoms composing the low dielectric constant material causes a thermal decomposition and/or a degassing of the low dielectric constant material during a high-temperature thermal processing. Thus, when the multiple-layered interconnect layer 11B is formed, it is necessary to set the upper limit of the process temperature within a range of from 350 to 400 degrees Centigrade even in a process for forming the magnetic shielding film 15 together with the forming the multiple-layered interconnect layer 11B. Since the magnetic shielding film 15 is formed on the buffer film 14 functioning as protecting the diffusion of the magnetic material in the magnetic shielding structure in the above-described embodiment, higher-leveled crystallization of the magnetic shielding film 15 can be achieved, even in the process of relatively lower temperature, which is typically include the upper limit of around 350 to 400 degrees Centigrade.

When spinel ferrite is particularly employed for the magnetic shielding film 15, the formation of the magnetic shielding film 15 having higher crystallinity can be achieved. Therefore, the buffer film 14 is formed on the semiconductor device 12 at a process temperature adapted for the process for forming the interconnect layer and furthermore, the magnetic shielding film 15 of spinel ferrite is formed on the buffer film 14, so that the semiconductor apparatus 10, which is capable of achieving both of a prevention for diffusion of the magnetic material and better magnetic shielding effect, can be presented.

Second Embodiment

Figure 18:
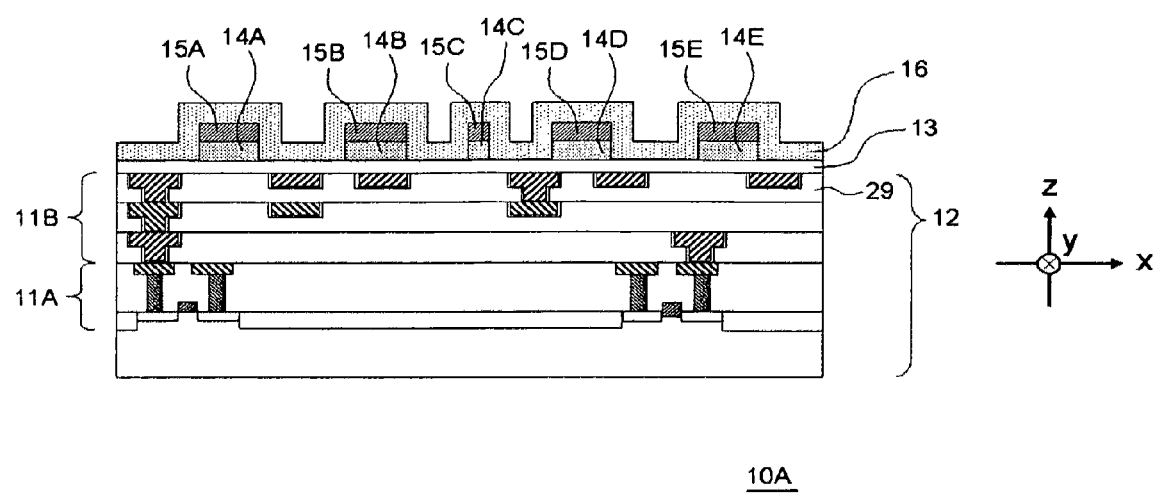
FIG. 18 is a diagram which schematically shows a sectional structure of a semiconductor apparatus of second embodiment according to the present invention.

Next, second embodiment according to the present invention will be described. FIG. 18 is a diagram, which schematically shows a sectional structure of a semiconductor apparatus 10A of second embodiment. The semiconductor apparatus 10 of the above-described first embodiment has no concavity and convexity in the whole structure, and the magnetic shielding film 15 having flat faces is formed. On the contrary, the semiconductor apparatus 10A of second embodiment includes buffer films 14A, 14B, 14C, 14D and 14E, and includes magnetic shielding films 15A, 15B, 15C, 15D and 15E which are processed into predetermined shapes and sizes. An upper buffer film 16 is formed so as to cover the magnetic shielding films 15A, 15B, 15C, 15D and 15E. Materials composing the buffer films 14A to 14E and the upper buffer film 16 are the same as employed in forming the buffer film 14 in first embodiment (FIG. 1).

The semiconductor apparatus 10A includes transistor layer 11A and multiple-layered interconnect layers 11B, which have the similar configuration as employed in the semiconductor apparatus 10 of first embodiment (FIG. 1). The process for manufacturing the semiconductor apparatus 10A is as follows. An insulating film (dielectric film) 13 is formed on the top of the multiple-layered interconnect layers 11B according to the manufacturing process similar as employed in first embodiment. Subsequently, the buffer films and the magnetic shielding films are consecutively formed on the top of the insulating film 13 according to the manufacturing process similar as employed in first embodiment. Thereafter, the layered structure formed of the buffer films and the magnetic shielding films is processed by utilizing an etching process, an ion milling process, or applying and exposing technique with a resist to form the buffer films 14A, 14B, 14C, 14D and 14E and the magnetic shielding films 15A, 15B, 15C, 15D and 15E shown in FIG. 18. Furthermore, an upper buffer film 16, which covers the buffer films 14A to 14E and the magnetic shielding films 15A to 15E, is formed via, for example, DC sputter process.

The semiconductor apparatus 10A of second embodiment and the process for manufacturing thereof exhibit advantageous effects similar to that obtained by employing the semiconductor apparatus 10 of the above-described first embodiment and the process for manufacturing thereof, and further exhibit the advantageous effect as described below. First of all, since the magnetic shielding films 15A to 15E are completely covered with the upper buffer film 16, the diffusion of the magnetic material toward the upward direction can be completely prevented. Here, it may be sufficient that the buffer films 14A to 14E have thicknesses, which is sufficient to reduce the diffusion of the materials composing the magnetic shielding films 15A to 15E. On the other hand, the thickness of the buffer films 14A to 14E may be preferably equal to or smaller than 20 nm. This allows the sheet resistance of the buffer films 14A to 14E to be not excessively decreased, resulting in a prevention for a decrease of eddy current loss.

Each of the magnetic shielding films 15A to 15E is processed to have a convex shape, which protrudes toward the direction (y-direction) perpendicular to the cross section shown in the diagram. In such way, the width (width in x-direction) of each of the magnetic shielding films 15A to 15E is limited to allow providing a geometry magnetic anisotropy. More specifically, each of the magnetic shielding films 15A to 15E may have an axis of easy magnetization (i.e., a direction for easily orienting the magnetization of the magnetic material) in a direction along x-y plane, and a difficult axis of magnetization (difficult direction for orienting the magnetization of the magnetic material) in z-direction (film thickness-direction).

In addition, since the total cross sections of the all of the magnetic shielding films 15A to 15E are reduced, the resistance of the magnetic shielding film is effectively increased, and the eddy current loss at higher frequency can be reduced.

The magnetic shielding films 15A to 15E shown in FIG. 18 are processed to have convex shapes in the present embodiment, no limitation thereto intended. The magnetic shielding films may alternatively be processed into geometric shapes such as: convex shapes that mutually intersects in a x-y plane (for example, crisscross shapes, or shapes of hexagonal lattices); circular-shapes; or ring-shapes. A magnetic shielding effect corresponding to the magnetic structure according to the processed geometry can be utilized.

The convex shapes can be utilized as magnetic nanowires by sufficiently narrowing widths of the convex shapes of the magnetic shielding films 15A to 15E. The magnetic nanowire of ferromagnetic material has stronger geometric anisotropy, and is easily magnetized in longitudinal direction to create a single-domain configuration. Therefore, magnetic nanowires extending toward x-direction, y-direction and z-direction are created to create a single-domain configuration, which has magnetic geometric anisotropy and is magnetized in x-direction, y-direction and z-direction, respectively. The magnetic resonance frequency can be enhanced by providing magnetic anisotropy to the magnetic shielding film.

The magnetic shielding film 15 shown in FIG. 1 can be micro-fabricated to form single-domain configuration of the magnetic nanowires or magnetic wall or to form domain wall by superposition of magnetic nanowires. In addition, the magnetic shielding film 15 is processed according to the frequency related to the electromagnetic noise or the propagating direction thereof to create the magnetic wall. When a plurality of magnetic nanowires are created to form hexagon grid geometry or crisscross geometry, a single magnetic wall is formed in a section that the magnetic nanowires having single-domain configuration intersect. The magnetic domain wall resonance due to the magnetic wall can be utilized to achieve reducing the electromagnetic noise.

FIG. 19B and FIG. 19C are diagrams, which schematically show an example of a magnetic nanowire structure. FIG. 19B is a diagram, which schematically shows cross sections of sections of the magnetic nanowire configuration, and FIG. 19C is a perspective view of the magnetic nanowire configuration shown in FIG. 19B. The magnetic nanowire configuration is created by carrying out processes such as etching and the like over the layered structure shown in FIG. 19A. As shown in FIGS. 19B and 19C, a magnetic thin film 15G is formed as a base layer on the buffer film 14, and magnetic nanowires 150 and 151 are formed on the magnetic thin film 15G. In this way, a combination of the base layer 15G and the magnetic nanowires 150 and 151 allows introducing the axis of easy magnetization in the direction along x-y plane and the axis of easy magnetization in z-direction. The axis of easy magnetization along the direction for propagating the electromagnetic noise is introduced to provide an improved response of the magnetization of the magnetic shielding films. On the contrary, since the difficult axis of magnetization is easily created along z-direction (thickness direction) in the magnetic shielding film 15 of first embodiment, permeability in z-direction is lower. Thus, a response of magnetization in z-direction component of external magnetic field is lower than a response of magnetization in x-direction component or y-direction component of the external magnetic field.

Third Embodiment

Next, third embodiment according to the present invention will be described. FIGS. 20A to 20C, FIGS. 21D and 21E, FIGS. 22F and 22G, and FIGS. 23H and 23I are cross-sectional views, showing manufacturing process of the semiconductor apparatus 10B (FIG. 23I) of third embodiment.

First of all, the transistor layer 11A and the multiple-layered interconnect layers 11B including the interconnects of the inductors 62 shown in FIG. 1 are formed. Then, as shown in FIG. 20A, fifth interlayer insulating film 30 is formed on the multiple-layered interconnect layer 11B.

Figure 20A:
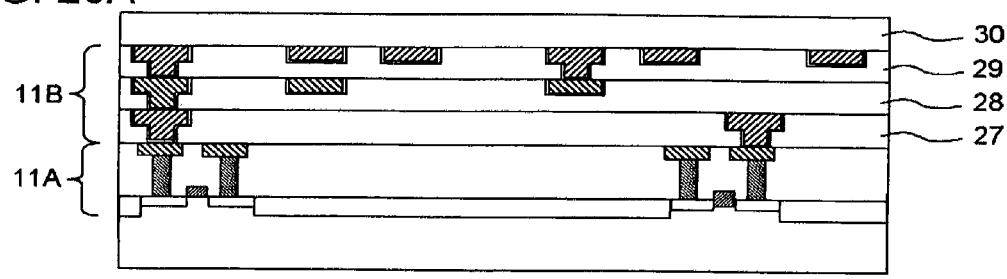
FIGS. 20A to 20C are cross-sectional views, illustrating a process for manufacturing a semiconductor apparatus of third embodiment according to the present invention.
Figure 20B:
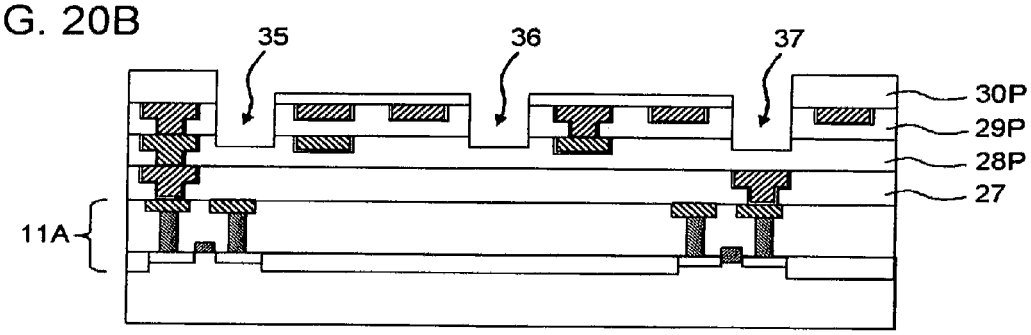
Figure 20C:
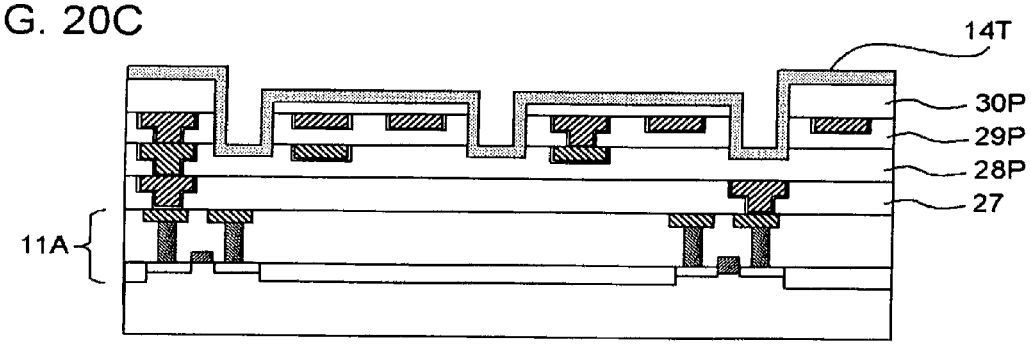

Then, the multiple-layered structure composed of the third interlayer insulating film 28, the fourth interlayer insulating film 29 and the fifth interlayer insulating film 30 shown in FIG. 20A is processed via an etching process to form concave regions 35, 36 and 37 shown in FIG. 20B. The concave regions (trenches) 35 and 37 are formed in an outer region of the inductor, and the concave region (trench) 36 is formed in the central region of a wound wire structure of the inductor.

Figure 21D:
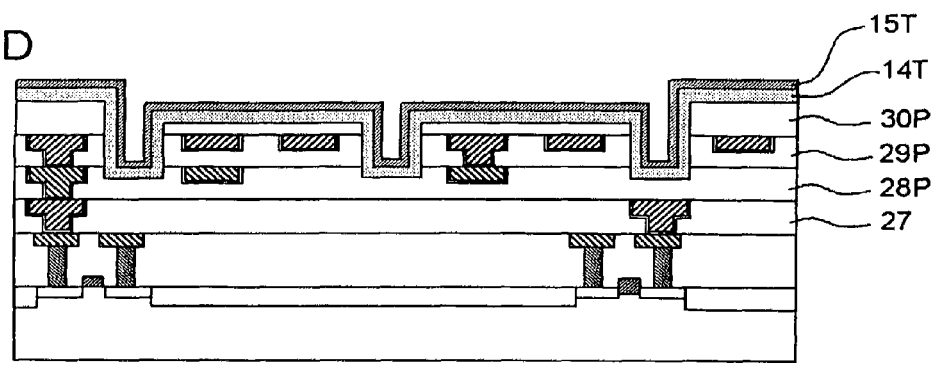
FIGS. 21D and 21E are cross-sectional views, illustrating process for manufacturing the semiconductor apparatus of third embodiment.

Next, a lower buffer film 14T is deposited on the entire surface of the multiple-layered structure shown in FIG. 20B via a sputter process. The material composing the lower buffer film 14T is the same as that employed for the above-described buffer film 14 (FIG. 1). Subsequently, a magnetic shielding film 15T is formed on the lower buffer film 14T via, for example, RF magnetron sputter process as shown in FIG. 21D. Here, it may be sufficient that an upper limit of the process temperature during the process for forming the magnetic shielding film 15T may be set to fall within a range of from 300 to 400 degrees Centigrade according to the upper limit of the temperature of the cold process (plating process or sputter process) for forming the multiple-layered interconnect layers 11B.

Figure 21E:
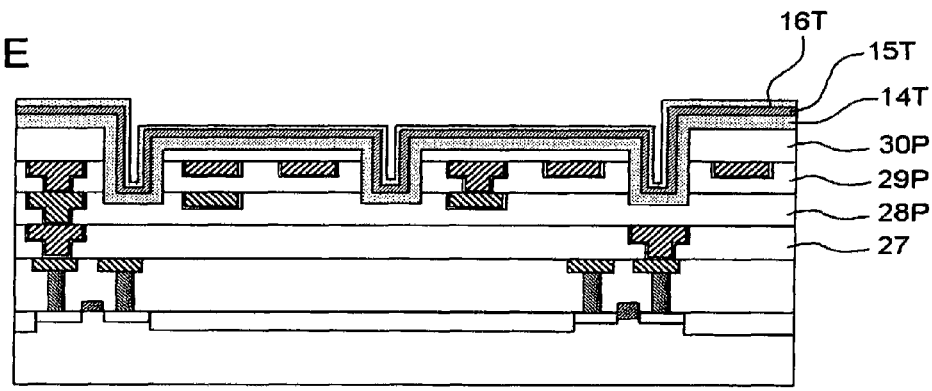
Figure 22F:
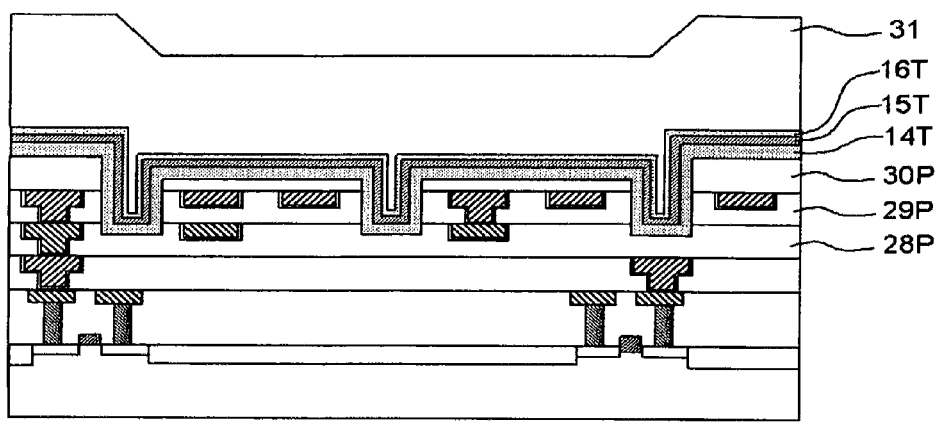
FIGS. 22F and 22G are cross-sectional views, illustrating process for manufacturing the semiconductor apparatus of third embodiment.
Figure 22G:
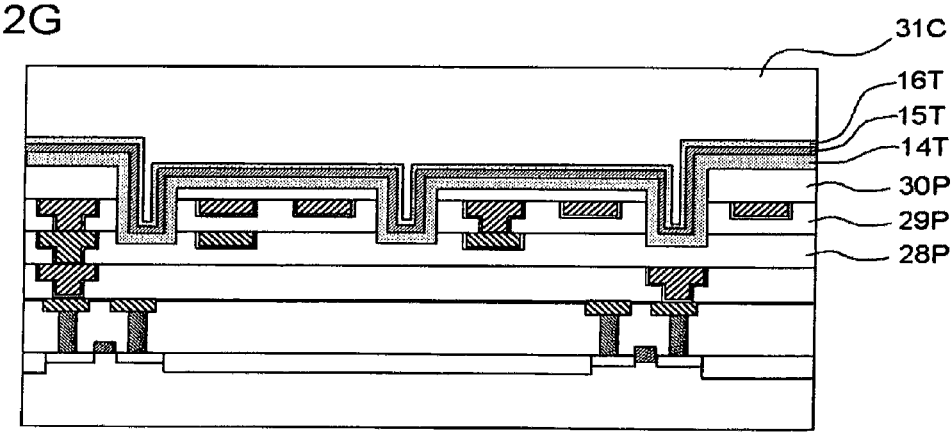

Then, an upper portion buffer film 15T continuously covering the magnetic shielding film 15T is deposited via, for example, DC sputter process (FIG. 21E). Next, a sixth interlayer insulating film 31 composed of a hard mask material such as silicon oxide, silicon nitride and the like is formed over the entire surface of the multiple-layered structure of FIG. 21E (FIG. 22F). The upper surface of the sixth interlayer insulating film 31 is planarized via a CMP process (FIG. 22G). Then, over the sixth interlayer insulating film 31C of FIG. 22G, a patterned mask (not shown) having an opening is formed in a region except the region in which the inductor is formed.

Figure 23H:
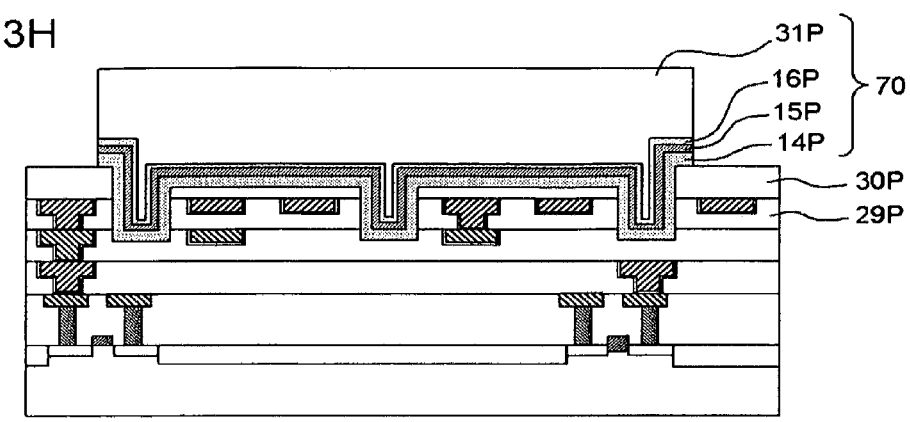
FIGS. 23H and 23I are cross-sectional views, illustrating process for manufacturing the semiconductor apparatus of third embodiment.

Then, the multiple-layered structure composed of the lower buffer film 14T, the magnetic shielding film 15T, the upper portion buffer film 15T and the sixth interlayer insulating film 31C is selectively processed via an etching process employing the patterned mask. As a result, as shown in FIG. 23H, a magnetic shielding structure 70 is formed to selectively cover only the region in which the inductor is formed. This magnetic shielding structure 70 includes the buffer film 14P, magnetic shielding film 15P and upper portion buffer film 16P which are processed into predetermined shapes and sizes.

Figure 23I:
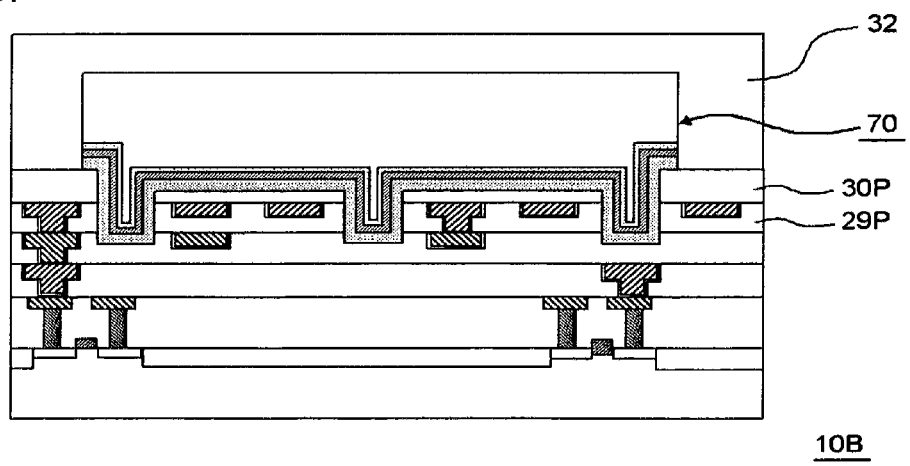

Next, an interlayer insulating film is formed over the entire surface of the multiple-layered structure shown in FIG. 23H, and the upper surface of the interlayer insulating film is planarized via a CMP process to obtain the semiconductor apparatus 10B of third embodiment shown in FIG. 23I. As shown in FIG. 23I, a seventh interlayer insulating film 32 is formed so as to completely cover the magnetic shielding structure 70. In addition to above, a new interconnect may be provided in the structure of FIG. 23I, after the operation of FIG. 23I.

The semiconductor apparatus 10B of third embodiment and the process for manufacturing thereof exhibit advantageous effects similar to that obtained by employing the semiconductor apparatus 10 of the above-described first embodiment and the process for manufacturing thereof, and further exhibit the advantageous effect as described below. The semiconductor apparatus 10B includes concave and convex regions formed in the third interlayer insulating film 28P, the fourth interlayer insulating film 29P and the fifth interlayer insulating film 30P. The buffer film 14P, the magnetic shielding film 15P and the upper portion buffer film 16P are formed along with the surface of the concave and convex regions. The concave or convex shape of the magnetic shielding film 15P can be controlled to exhibit as larger magnetic shielding effect as possible, in correspondence with the position and shape of the interconnect structure which may be a noise source. This allows reducing not only noise component propagating along the thickness direction, but also noise component propagating along z-direction, which is perpendicular to the thickness direction.

Since the magnetic shielding film 15 of the first embodiment is a flat film expanding in parallel with x-y plane as shown in FIG. 1, the difficult axis of magnetization is easily occurred in z-direction (thickness direction) of the magnetic shielding film 15, and the axis of easy magnetization is easily oriented toward the direction along x-y plane of the magnetic shielding film 15. Consequently, while higher effect for reducing component of noise propagating the direction along x-y plane is achieved, the effect for reducing component of noise propagating z-direction is still not high. On the contrary, the use of the magnetic shielding film 15P of the third embodiment can achieve effectively reduce component of noise propagating along z-direction.

In addition, as shown in FIG. 23I, the magnetic shielding structure 70 is buried within the seventh interlayer insulating film 32. Consequently, it is advantageous that the magnetic shielding structure 70 does not adversely affect the process for forming the upper interconnect layer, even if the structure of FIG. 23I is further provided with an upper interconnect layer.

Further, as shown in FIG. 23I, the concave region of magnetic shielding film 15P constituting the magnetic shielding structure 70 is formed in the central region of the wound wire structure so as to extend through the center of the inductor. In same time, the magnetic shielding film 15P is formed to surround the inductor from the outside. Consequently, an improved inductance L of the inductor can be provided, and the magnetic flux generated in the inductor can be effectively utilized.

As described above, in RF analog circuits including LCR circuit structure, achievement of the increased functions and reduced dimensional area of the inductor is urgently required, as the degree of the integration of the semiconductor chip is increased. Thus, it is required to provide an increased inductance L without changing the dimension of the inductor, or sufficiently higher inductance L can be obtained even if the dimensional area of the inductor is reduced. A high-permeability magnetic material of the magnetic shielding film 15P is employed as a core of the inductor in the present embodiment, so that the density of magnetic flux in the inductor can be increased. Therefore, achievement of the increased functions and reduced dimensional area of the inductor can be provided.

While the structure of FIG. 23I illustrates that the magnetic shielding film 15P is configured to substantially extend through the central region of the inductor, the configuration is not limited thereto. For example, a formation of the magnetic shielding film 15P in a part of the central region of the inductor or in vicinity thereof may also increase the inductance L, so that achievement of the increased functions and reduced dimensional area of the inductor can be provided.

Fourth Embodiment

Figure 24:
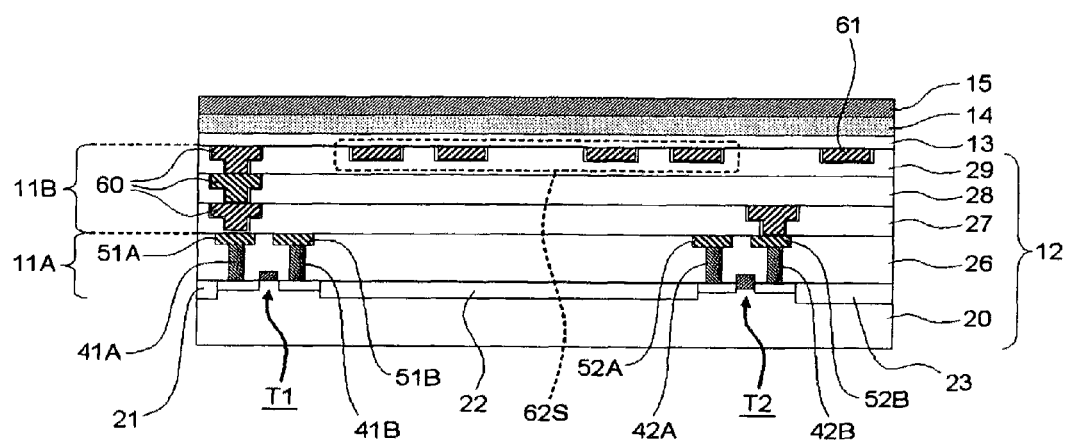
FIG. 24 is a cross-sectional view, schematically illustrating a structure of a semiconductor apparatus of fourth embodiment according to the present invention.

Next, fourth embodiment according to the present invention will be described. FIG. 24 is a cross-sectional view, schematically illustrates a structure of a semiconductor apparatus 10S of fourth embodiment. The semiconductor apparatus 10S has a configuration, which is similar as the semiconductor apparatus 10 of first embodiment (FIG. 1), except for a structure of an inductor 62S. More specifically, while the inductor 62 of first embodiment is configured to be formed in a plurality of interconnect layers (interlayer insulating films) 28 and 29, the inductor 62S of the present embodiment is configured to be formed in a single interconnect layer (fourth interlayer insulating film) 29. The semiconductor apparatus 10S may be manufactured via a manufacturing process that is similar as the manufacturing process of first embodiment.

The inductor 62 of first embodiment may be configured by, for example, coupling flat panel spiral inductors respectively formed in the interconnect layers 28 and 29 in series through via hole conductors. On the contrary, the inductor 62S of the present embodiment may be configured to be a flat panel spiral inductor formed in a monolayer.

Since the semiconductor apparatus 10S of fourth embodiment includes the configuration that the buffer film 14 is disposed between the semiconductor device 12 and the magnetic shielding film 15, the advantageous effect same as the semiconductor apparatus 10 of first embodiment is presented. The magnetic shielding effect is not limited by the structure of the inductor, and provides reduced extension of the inducing magnetic flux of the inductor and enhanced density of the magnetic flux density of core section, so that the magnetic efficiency of the inductor is enhanced.

Fifth Embodiment

Next, fifth embodiment according to the present invention will be described. A semiconductor device of a semiconductor apparatus of fifth embodiment includes a plurality of memory cells having an interconnect layer and a magnetoresistive device electrically coupled to the interconnect layer. The semiconductor apparatus includes a magnetic shielding film, which is formed so as to cover at least the region in which the memory cell is formed. Here, a tunneling magnetoresistive (TMR) element is employed for the magnetoresistive device.

Figure 25A:
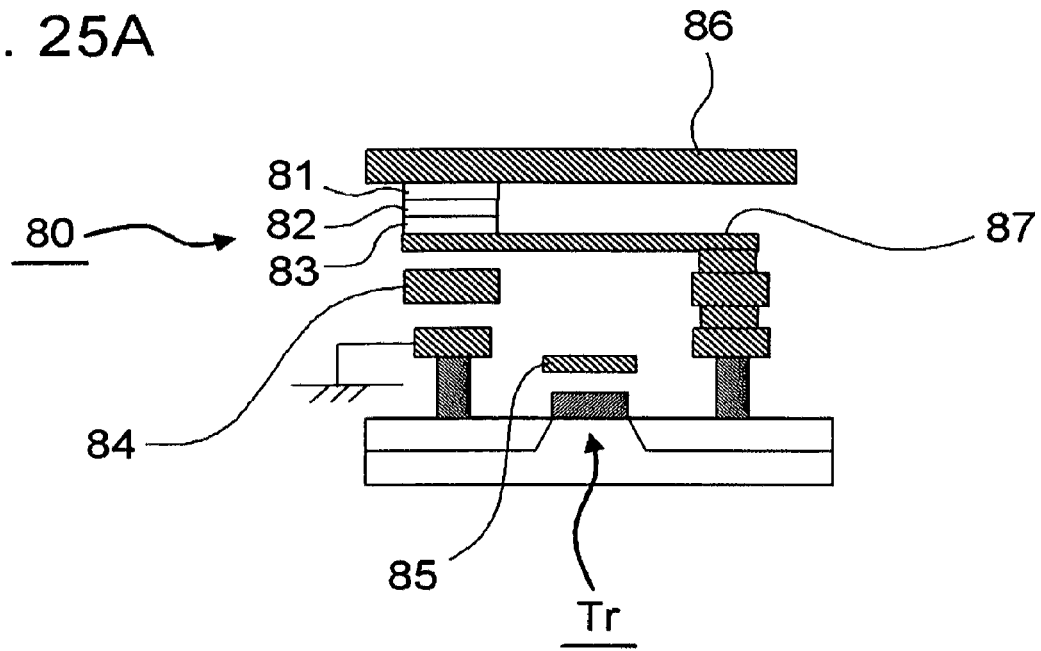
FIG. 25A is a cross-sectional view schematically illustrating a basic structure of the memory cell.
Figure 25B:
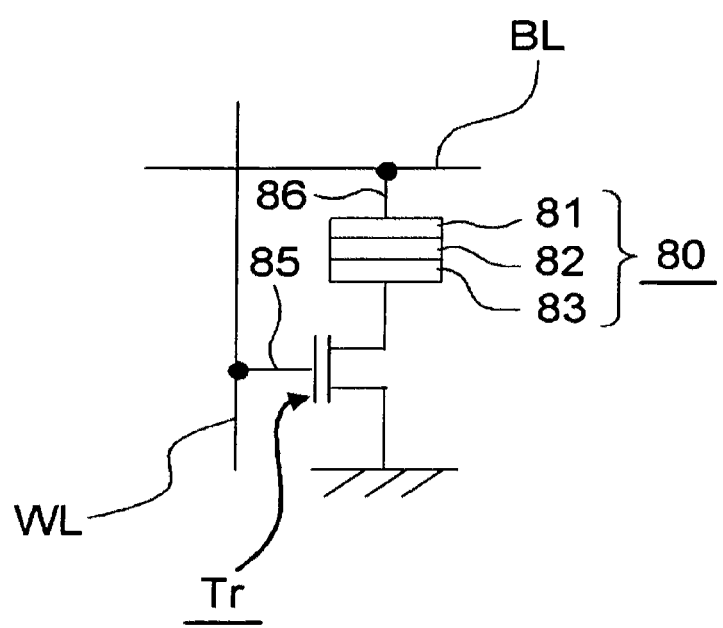
FIG. 25B is an equivalent circuit schematic of the memory cell of FIG. 25A.
Figure 28:
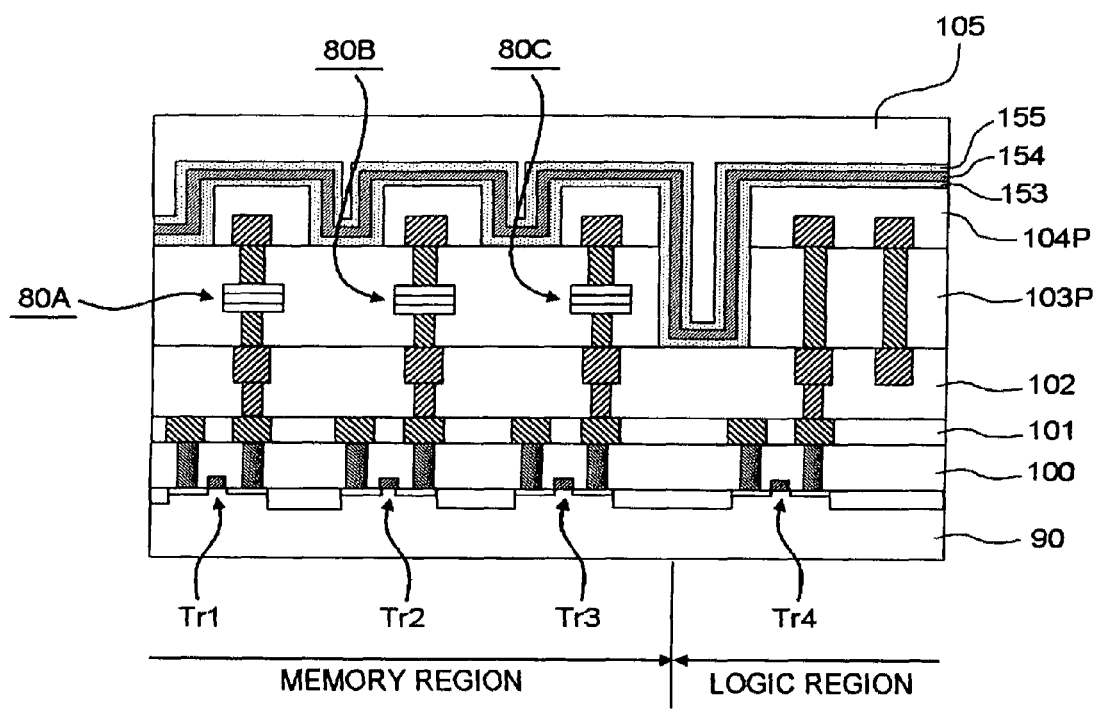
FIG. 28 is a cross-sectional view illustrating a process for manufacturing a semiconductor apparatus of fifth embodiment.
Figure 29:
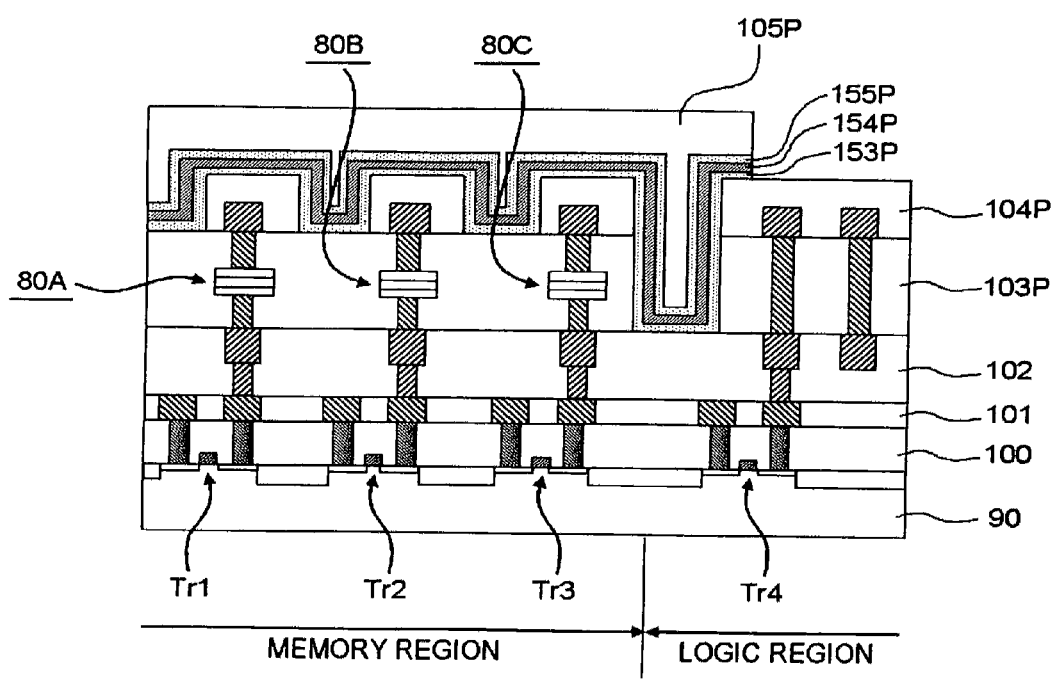
FIG. 29 is a cross-sectional view illustrating a process for manufacturing a semiconductor apparatus of fifth embodiment.
Figure 30:
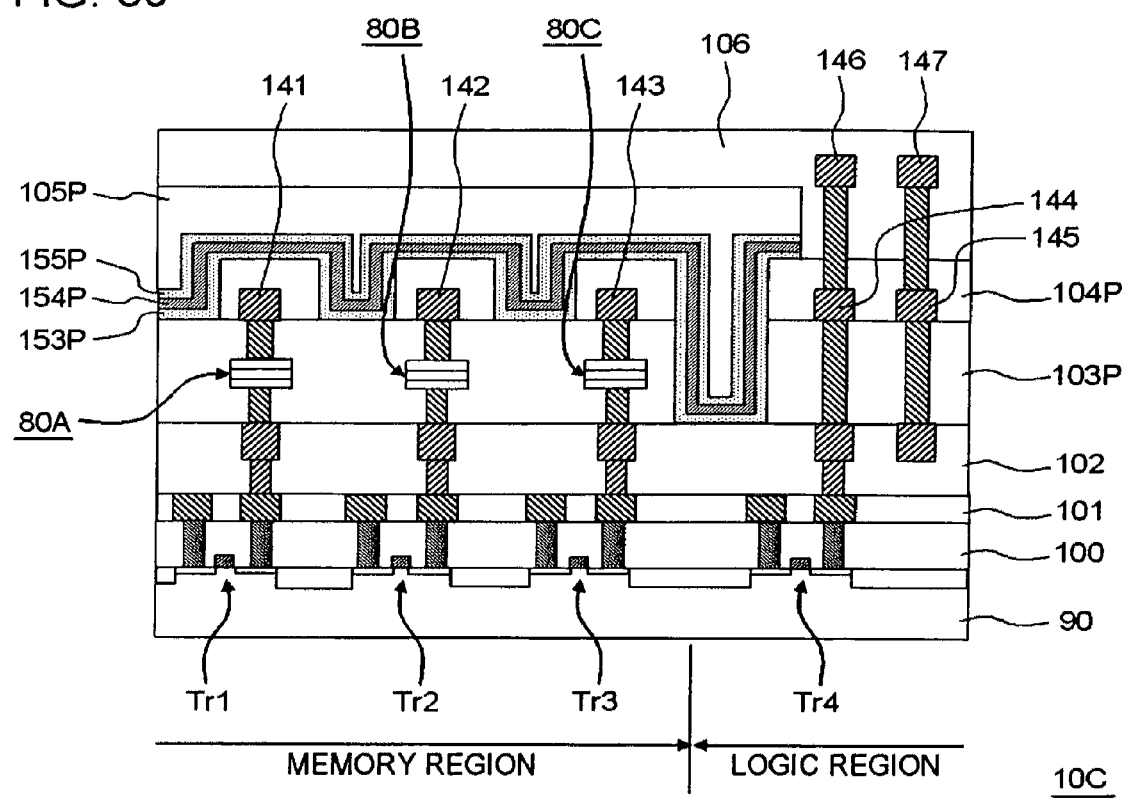
FIG. 30 is a cross-sectional view illustrating a process for manufacturing a semiconductor apparatus of fifth embodiment.

FIG. 26 to FIG. 30 are cross-sectional views, illustrating a process for manufacturing a semiconductor apparatus 10C of fifth embodiment (FIG. 30). The semiconductor apparatus 10C shown in FIG. 30 has a magnetic shielding structure, which covers a semiconductor device including a memory cell having basic structure shown in FIG. 25A and FIG. 25B. FIG. 25A is a cross-sectional view, schematically illustrating a basic structure of the memory cell, and FIG. 25B is an equivalent circuit schematic of the memory cell of FIG. 25A.

First of all, a basic structure of the memory cell will be described, in reference to FIG. 25A and FIG. 25B. The memory cell is a magnetic random access memory (MRAM) element utilizing a TMR device 80. As shown in FIG. 25A, the TMR device 80 has a layered structure including a tunnel insulating film 82, which is disposed between a ferromagnetic layer (pin layer) 81 and a ferromagnetic layer (free layer) 83. The MRAM device is a nonvolatile memory that utilizes a tunnel magnetoresistance effect of the TMR device 80.

As shown in FIG. 25A, the memory cell includes the TMR device 80, a writing interconnect 84, a transistor Tr, an interconnect 85 for word line, an interconnect 86 for bit line, and an interconnect 87. For the ferromagnetic layers 81 and 83 that interleave the insulating film 82, one ferromagnetic layer 81 is coupled to the interconnect 86 for bit line, and the other ferromagnetic layer 83 is coupled to the drain region of the transistor Tr through the interconnect 87. As shown in FIG. 25B, a source region of the transistor Tr is grounded. A gate electrode of the transistor Tr is coupled to a word line WL through the interconnect 85. One ferromagnetic layer 81 of the TMR device 80 is coupled to a bit line BL through the interconnect 86.

Typical constituent material for the ferromagnetic layers 81 and 83 includes, for example, cobalt-platinum alloy (Copt), iron-platinum alloy (FePt) and the like. An amorphous film of aluminum oxide ($Al_2O_3$) or the like, or a monocrystalline film of magnesium oxide (MgO) or MgO/Mg, may be employed as a constituent material of the tunnel insulating film 82. Each of the ferromagnetic layers 81 and 83 may be a multiple-layered structure.

A difference is caused in tunneling magnetoresistivity of the TMR device 80 between a case in which orientations of magnetizations (spins) of the ferromagnetic layers 81 and 83 sandwiching the tunnel insulating film 82 are in parallel state and a case in which orientations of magnetizations of the ferromagnetic layers 81 and 83 are in anti-parallel state. The difference in the tunneling magnetoresistivity may be utilized to allow the TMR device 80 memorizing binary digit (bit) information of "0" or "1". The value of the tunneling magnetoresistivity is detected as difference in the output voltage between the word line WL and the bit line BL, and bit information is read based on the detection results. Rewriting of bit information is carried out by flowing an electric current through the bit line BL and the word line WL to apply external magnetic field over the ferromagnetic layers 81 and 83. The application of the external magnetic field allows setting the orientations of the magnetization of the ferromagnetic layers 81 and 83 in either of the parallel state or the anti-parallel state.

In addition to above, an orientation of at least one of the magnetizations of the ferromagnetic layers 81 and 83 may be controlled by introducing the magnetic coupling among the ferromagnetic films by the multiple-layered configuration of the ferromagnetic film/non-magnetic film/ferromagnetic film, in order to prevent for changing the orientations of the magnetizations of the ferromagnetic layers 81 and 83 by an external magnetic field and/or a thermal fluctuation. For example, Ru, Cu or chromium (Cr) may be employed for the non-magnetic film of the multiple-layered configuration. The method for changing the magnetized state of the ferromagnetic layers 81 and 83 is not particularly limited to the above-mentioned method for utilizing the external magnetic field. A method for simultaneously writing and reading bit information by directly applying spin-polarized electron over at least one of the ferromagnetic layers 81 and 83 to provide spin torque may be adopted.

Next, a process for manufacturing the semiconductor apparatus 10C of fifth embodiment (FIG. 30) will be described in reference to FIG. 26 to FIG. 30. The semiconductor apparatus 10C includes a memory region having a plurality of memory cells formed therein, each of which has a basic configuration of FIG. 25A, and a logic region having a logic circuitry formed therein, both of which are installed in one semiconductor substrate 90.

Figure 26:
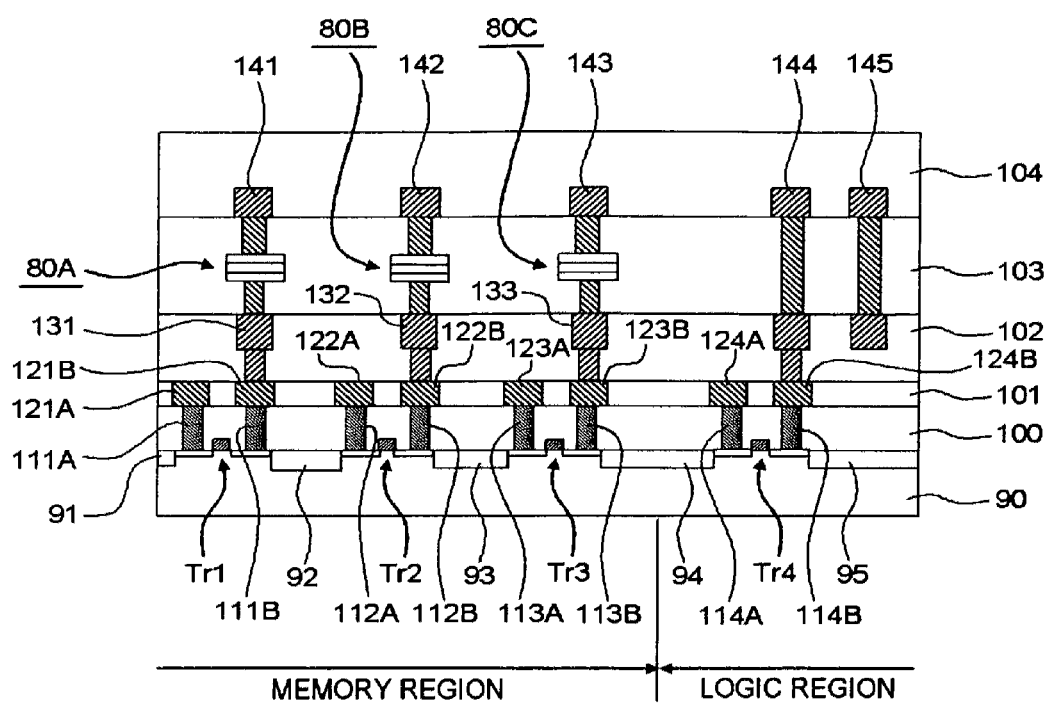
FIG. 26 is a cross-sectional view illustrating a process for manufacturing a semiconductor apparatus of fifth embodiment according to the present invention.

While an example of a sectional configuration of the semiconductor device is schematically shown in FIG. 26, the present invention is not particularly limited thereto. The semiconductor device includes transistors Tr1, Tr2, Tr3 and Tr4, which are formed on the semiconductor substrate 90. Each of the transistors Tr1, Tr2, Tr3 and Tr4 is an n-type or a p-type MOS transistor, which includes a gate electrode, a source diffusion region and a drain diffusion region. The transistors Tr1, Tr2 and Tr3 are devices for memory cells, and the transistor Tr4 is a device for a logic circuitry. The transistor Tr1 is isolated from the other elements by the element isolation regions 91 and 92 such as STI, the transistor Tr2 is isolated from the other elements by the element isolation regions 92 and 93, the transistor Tr3 is isolated from the other elements by the element isolation regions 93 and 94, and the transistor Tr4 is isolated from the other elements by the element isolation regions 94 and 95.

A first interlayer insulating film 100 is formed on the transistors Tr1, Tr2, Tr3 and Tr4. The first interlayer insulating film 100 includes contact plugs 111A, 111B, 112A, 112B, 113A, 113B, 114A and 114B buried therein, which are coupled to the source diffusion region and the drain diffusion region of the transistors Tr1, Tr2, Tr3 and Tr4. A second interlayer insulating film 101 is formed on the first interlayer insulating film 100. The second interlayer insulating film 101 includes electrically conducting layers 121A, 121B, 122A, 122B, 123A, 123B, 124A and 124B buried therein, which are coupled to the contact plugs 111A, 111B, 112A, 112B, 113A, 113B, 114A and 114B. A third interlayer insulating film 102, a fourth interlayer insulating film 103 and a fifth interlayer insulating film 104 is consecutively formed on the second interlayer insulating film 101.

In the memory region, the third interlayer insulating film 102 includes interconnects 131,132 and 133 buried therein, which are electrically coupled to the conducting layers 121B, 122B and 123B. The fourth interlayer insulating film 103 includes TMR devices 80A, 80B and 80C formed therein, which are coupled to interconnects 131, 132 and 133, respectively. Furthermore, the fifth interlayer insulating film 104 includes interconnects 141,142 and 143 for bit lines buried therein, which are coupled to TMR devices 80A, 80B and 80C, respectively. On the other hand, the logic region includes interconnects 144 and 145 buried in through holes formed in the third interlayer insulating film 102, the fourth interlayer insulating film 103 and the fifth interlayer insulating film 104.

In addition to above, the first to the fifth interlayer insulating films 100 to 104 are preferably composed of low dielectric constant materials. Typical low dielectric constant material includes, for example, SiOC, SiC, SiOF, porous $SiO_2$, or porous SiOC.

Figure 27:
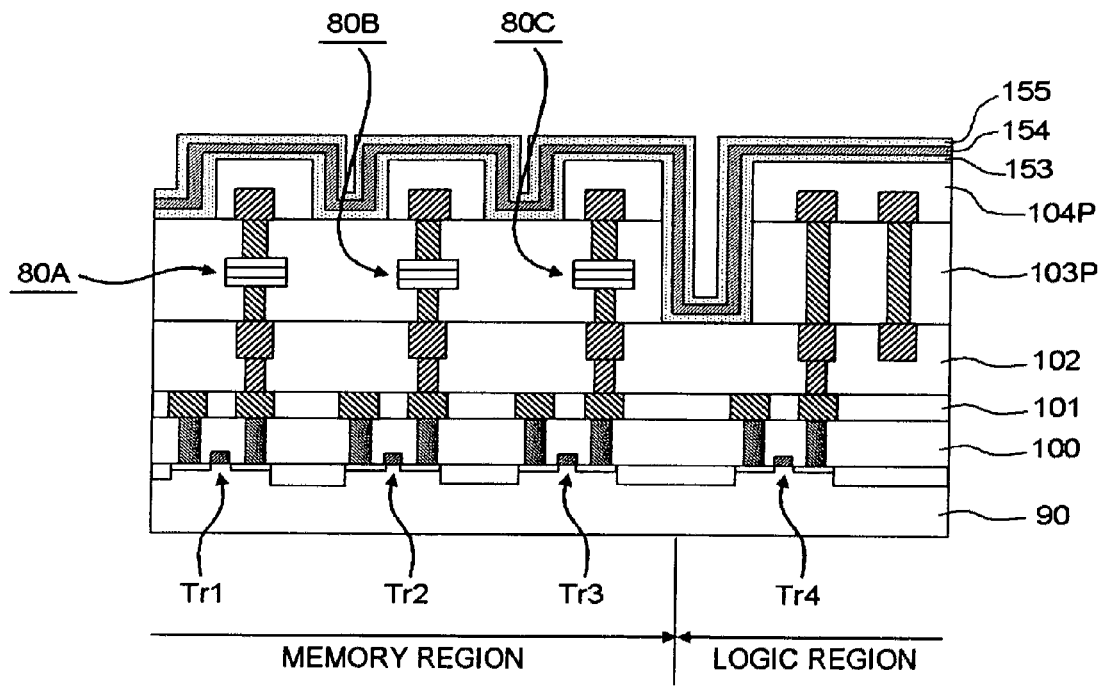
FIG. 27 is a cross-sectional view illustrating a process for manufacturing a semiconductor apparatus of fifth embodiment.

Then, the fourth interlayer insulating film 103 and the fifth interlayer insulating film 104 of the multiple-layered interconnect configuration shown in FIG. 26 are selectively processed via an etching process to form concave portions (trenches). As a result, as shown in FIG. 27, a fourth interlayer insulating film 103P and a fifth interlayer insulating film 104P having concave portions are formed. In a memory region, comparatively shallow concave portions are formed in the fifth interlayer insulating film 104P between TMR device 80A and TMR device 80B and between TMR device 80B and TMR device 80C, respectively. In addition, between the memory region and the logic region, relatively deep concave portions are formed in the fourth interlayer insulating film 103P and the fifth interlayer insulating film 104P. The concave portions are formed for the purpose of magnetically isolating the interconnects formed in the TMR devices 80A, 80B and 80C from the logic region.

Subsequently, lower buffer film 153 is deposited over the entire surface of the layered structure via a sputter process (FIG. 27). The material composing the lower buffer film 153 is the same as that employed for the above-described buffer film 14 in the above-described first embodiment (FIG. 14). Subsequently, a magnetic shielding film 154 (FIG. 27) is further formed on the lower buffer film 153 via, for example, RF magnetron sputter process. Here, it may be sufficient that an upper limit of the process temperature during the process for forming the magnetic shielding film 154 may be set to fall within a range of from 300 to 400 degrees Centigrade according to the upper limit of the temperature of the cold process (plating process or sputter process) for forming the multiple-layered interconnect layers.

Then, an upper portion buffer film 155 (FIG. 27) continuously covering the magnetic shielding film 154 is deposited via, for example, DC sputter process. Successively, a hard mask material such as silicon oxide, silicon nitride and the like is formed over the entire surface of the multiple-layered structure, and the deposited hard masking materials are polished via a CMP process to be planarized to form a sixth interlayer insulating film 105 (FIG. 28).

Then, the sixth interlayer insulating film 105 of FIG. 28 is processed via an etching process to form a patterned mask (not shown) substantially having an opening in a logic region and covering a memory region. Subsequently, the lower buffer film 153, the magnetic shielding film 154 and the upper buffer film 155 are selectively processed via an etching through the masking pattern.

As a result, as shown in FIG. 29, a lower buffer film 153P, a magnetic shielding film 154P an upper buffer film 155P and a sixth interlayer insulating film 105P are formed. Thus, the magnetic shielding configuration is formed to selectively cover only the region in which the memory cell is formed.

Then, a seventh interlayer insulating film 106 having interconnects 146 and 147 buried therein is formed over the entire surface of the layered structure shown in FIG. 29 to obtain the semiconductor apparatus 10C of fifth embodiment shown in FIG. 30. As shown in FIG. 30, the seventh interlayer insulating film 106 is formed so as to completely cover the magnetic shielding configuration. In addition to above, after the production process of FIG. 30, a new interconnect may be additionally provided in the configuration of FIG. 30.

The semiconductor apparatus 10C of fifth embodiment and the process for manufacturing thereof exhibit advantageous effects similar to that obtained by employing the semiconductor apparatus 10 of the above-described first embodiment and the process for manufacturing thereof, and further exhibit the advantageous effect as described below. First of all, since the magnetic shielding film 154P and the lower buffer film 153P are surrounded by the upper buffer film 155P as shown in FIG. 30, diffusion of the magnetic material can be prevented.

As shown in FIG. 30, the magnetic shielding film 154P includes a concave portion, which provides a magnetic isolation between the interconnects 141 and 142 for bit lines buried in the fifth interlayer insulating film 104P, and a concave portion, which provides a magnetic isolation between the interconnects 142 and 143 for bit lines. The interconnects 141,142 and 143 for bit lines are the interconnects that are applied with a writing-current when a bit information is written to TMR devices 80A, 80B and 80C. Since each of the interconnects 141,142 and 143 for bit lines are covered with the magnetic shielding film 154P, an external magnetic field generated by applying the writing-current can be increased. This allows reducing the magnitude of current required for writing the bit information, so that a reduction of the operating power can be achieved.

In addition, an absence of the magnetic shielding configuration shown in FIG. 30 may possibly cause a change of the orientation of the magnetization of the ferromagnetic layer composing the TMR devices 80A, 80B and 80C when the TMR devices 80A, 80B and 80C are exposed with electromagnetic noise from the outside. The magnetic shielding configuration shown in FIG. 30 allows shielding the TMR devices 80A, 80B and 80C from the influence of the electromagnetic noise, so that a malfunction of the memory cell can be prevented.

As described above, the semiconductor apparatus 10C of fifth embodiment has a magnetic shielding configuration, which provides reduced power consumption and improved reliability.

Sixth Embodiment

Figure 31A:
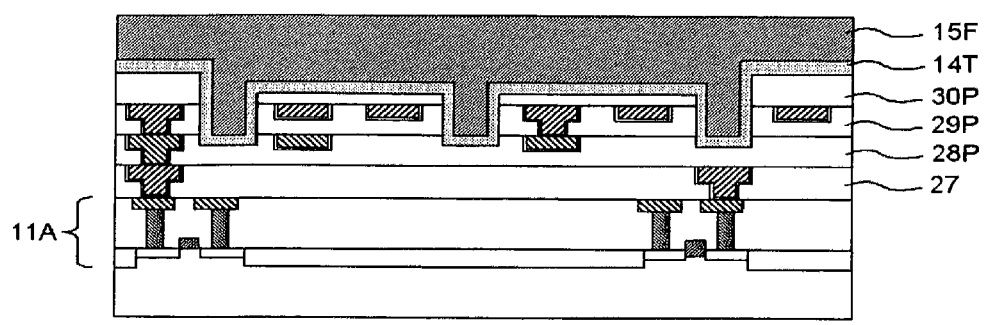
FIGS. 31A and 31B are cross-sectional views illustrating a process for manufacturing a semiconductor apparatus of sixth embodiment according to the present invention.
Figure 31B:
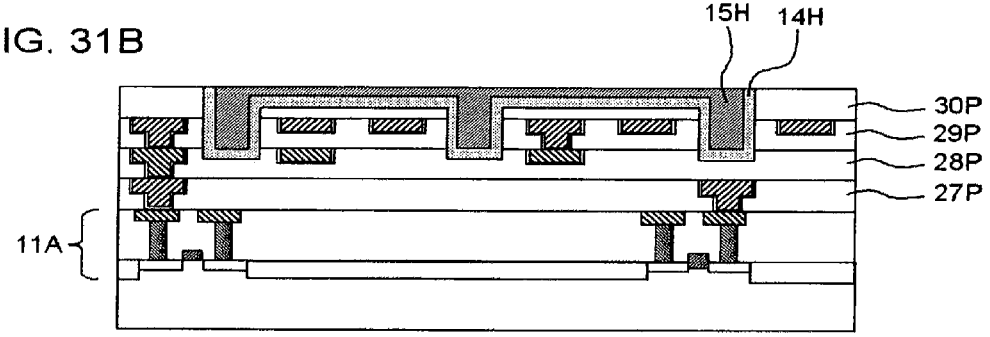

Next, sixth embodiment according to the present invention will be described. FIG. 31A and FIG. 31B are cross-sectional views, which schematically show a manufacturing process of a semiconductor apparatus of sixth embodiment. In the present embodiment, after the multiple-layered interconnect layer 11B shown in FIG. 1 is formed, a multiple-layered interconnect layer 11B is processed via an etching process to form to form a concave portion (trench) shown in FIG. 31A. Further, the buffer film 14T is formed in the concave portion, and subsequently, a magnetic material is buried in the concave portion via a sputter process or a plating process. Then, the buffer film 14T and the magnetic shielding film 15F are planarized via a CMP process to obtain a magnetic shielding configuration composed of a buffer film 14H and a buried magnetic shielding film 15H as shown in FIG. 31B.

In the semiconductor apparatus of sixth embodiment and the process for manufacturing thereof, the magnetic shielding configuration can be formed to selectively cover only the region in which the inductor is formed. Since the configuration having the magnetic shielding configuration extending through the periphery of the inductor and the central region of the inductor is obtained, the magnetic flux density can be effectively enhanced. After the configuration of FIG. 31B is obtained, the interconnect layer may be further formed.

Seventh Embodiment

Figure 32A:
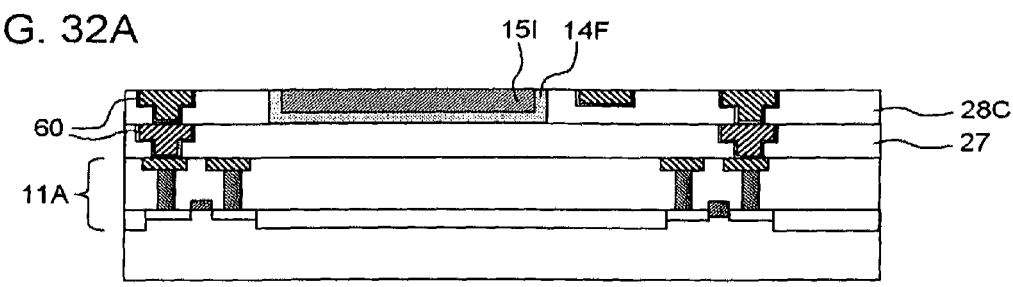
FIGS. 32A and 32B are cross-sectional views schematically illustrating structures of semiconductor apparatuses of seventh embodiment according to the present invention.

Next, seventh embodiment according to the present invention will be described. FIG. 32A is a cross-sectional view, which schematically shows a manufacturing process of a semiconductor apparatus of seventh embodiment. In the present embodiment, after the transistor layer 11A shown in FIG. 2A is formed, a second interlayer insulating film 27 having an interconnect and a third interlayer insulating film having an interconnect are formed.

Figure 32B:
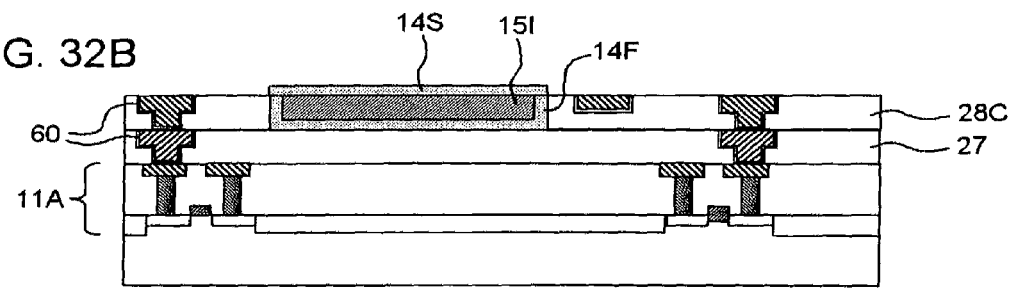

A concave region (trench) is formed in the third interlayer insulating film via an etching process to obtain a third interlayer insulating film 28C. Afterwards, a lower buffer film 14F is formed in the concave region, and subsequently, a magnetic material is deposited on the lower buffer film 14F. The deposited magnetic material is planarized via a CMP process to form a buried magnetic shielding film 15I shown in FIG. 32A. Furthermore, as shown in FIG. 32B, an upper buffer film 14S is selectively deposited so as to cover the magnetic shielding film 15I shown in FIG. 32A (FIG. 32B).

In the semiconductor apparatus of seventh embodiment and the process for manufacturing thereof, the magnetic shielding configuration, which provides a complete coverage of the upper buffer film 14S with the magnetic shielding film 15I and the lower buffer film 14F is formed. Thus, a leakage of the magnetic flux from a horizontal end of the magnetic shielding film 15I can be prevented.

Eighth Embodiment

Figure 32C:
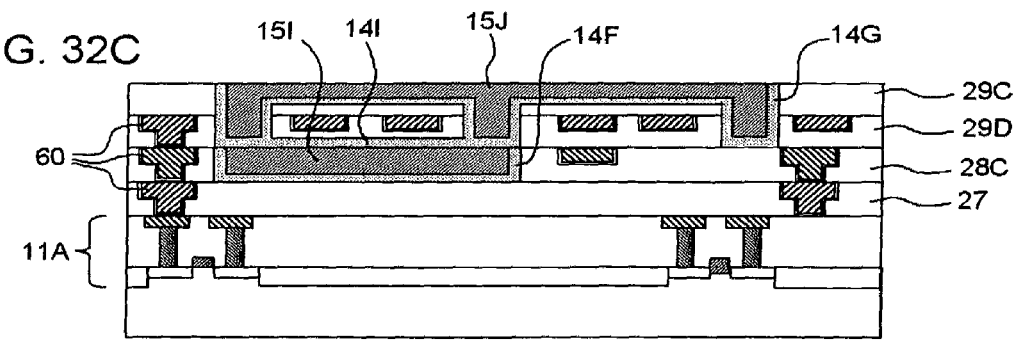
FIG. 32C is a cross-sectional view, schematically illustrating a structure of a semiconductor apparatus of eighth embodiment according to the present invention.

Now, FIG. 32C is a cross-sectional view, which schematically shows a configuration of a semiconductor apparatus of eighth embodiment according to the present invention. The semiconductor apparatus of the present embodiment includes buried magnetic shielding films 15I and 15J, which completely surround some interconnects among the shown interconnects through buffer films 14I and 14G. The buried magnetic shielding film 15I is buried through the buffer film 14F in a concave region (trench), which is formed in the third interlayer insulating film 28C via an etching process, a sputter process and a CMP process. In addition, the buried magnetic shielding film 15J is buried through the buffer film 14G in a concave region (trench), which is formed in a fourth interlayer insulating film 29D and a fifth interlayer insulating film 29C via an etching process, a sputter process and a CMP process.

In the semiconductor apparatus of eighth embodiment and the process for manufacturing thereof, the magnetic shielding configuration is formed, which covers some interconnects among the interconnects formed in the fourth interlayer insulating film 29D. This magnetic shielding configuration can be formed to have, for example, the shape that is conformable with the magnetic flux generated in interconnects of an inductor, to achieve an effectively enhanced magnetic flux density of the inductor.

Analysis of Simulations

Figure 33:
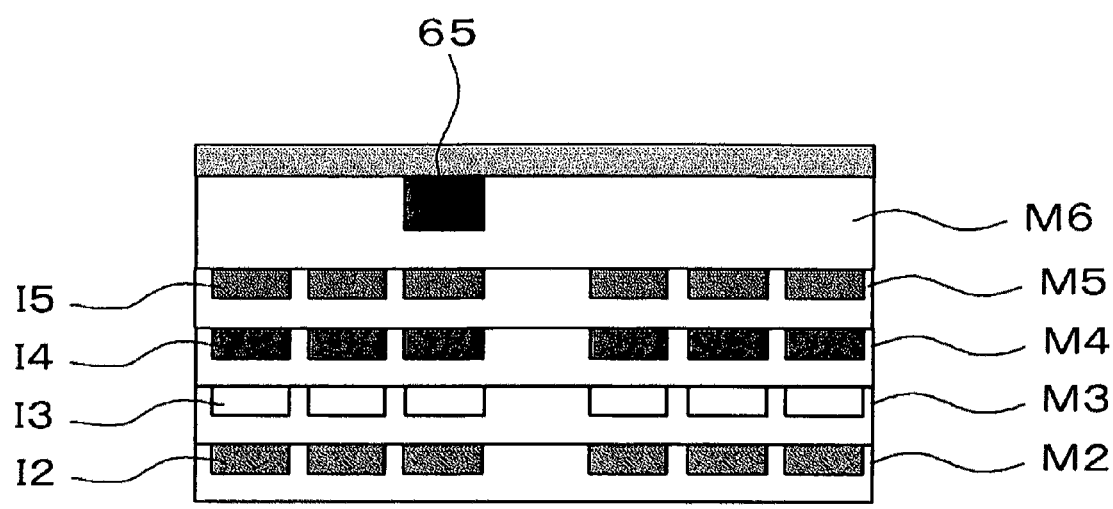
FIG. 33 is a schematic cross-sectional view along line A1-A2 of an inductor shown in FIG. 34.
Figure 34:
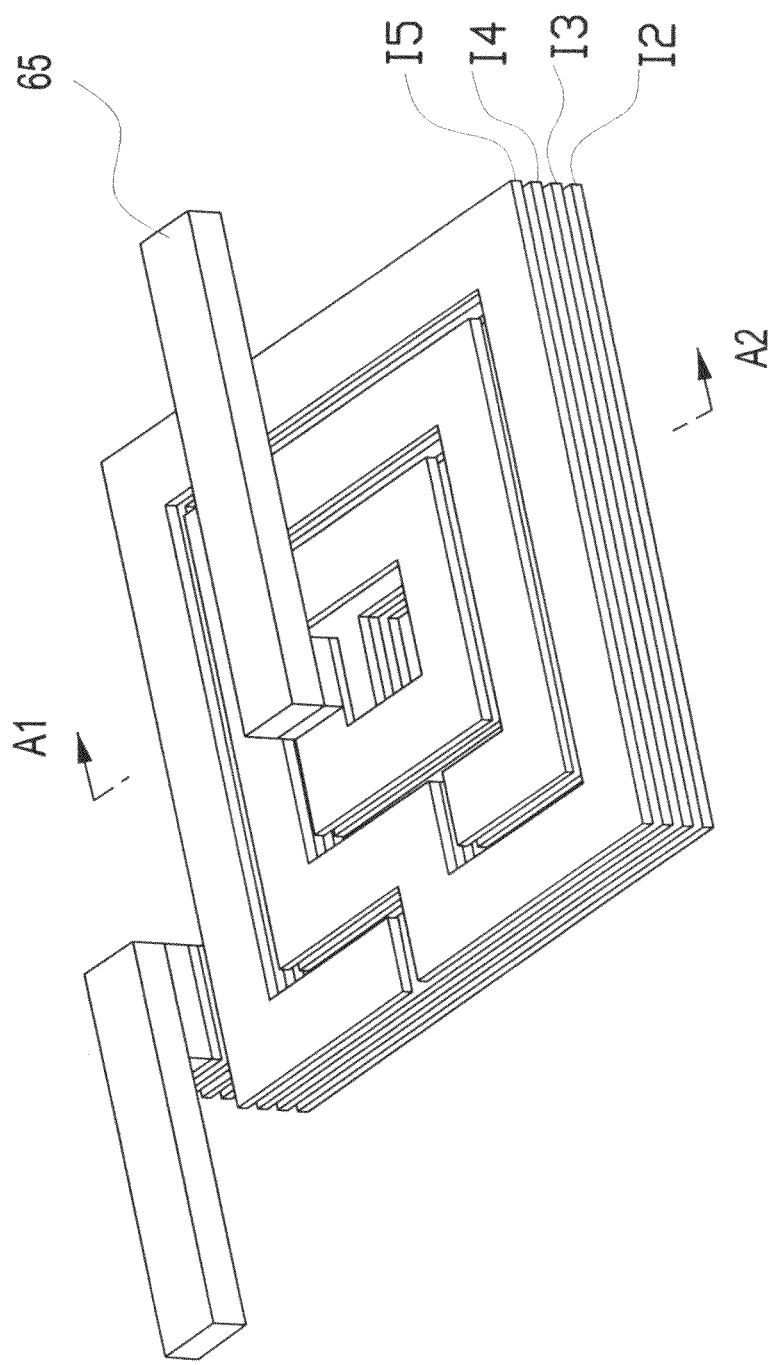
FIG. 34 is a schematic perspective view of an inductor.

Next, results of simulations of magnetic flux states by the inductor will be described. FIG. 33 and FIG. 34 are diagrams, which schematically illustrate a configuration of three-dimensional spiral inductor dedicated for simulations. FIG. 34 is a schematic perspective view of the three-dimensional spiral inductor, and FIG. 33 is a schematic cross-sectional view of the inductor along line A1-A2 shown in FIG. 34. The three-dimensional spiral inductor includes flat spiral inductors I2, I3, I4 and I5 formed in metallic interconnect layers M2, M3, M4 and M5, respectively, and an interconnect 65 coupled to the spiral inductor I5 in the highest layer.

The spiral inductors I2 to I5 are coupled in series through via hole conductors (not shown). In addition, each of the outer shapes of the spiral inductors I2 to I5 is a square shape having length on each side of about 17 μm.

Figure 35:
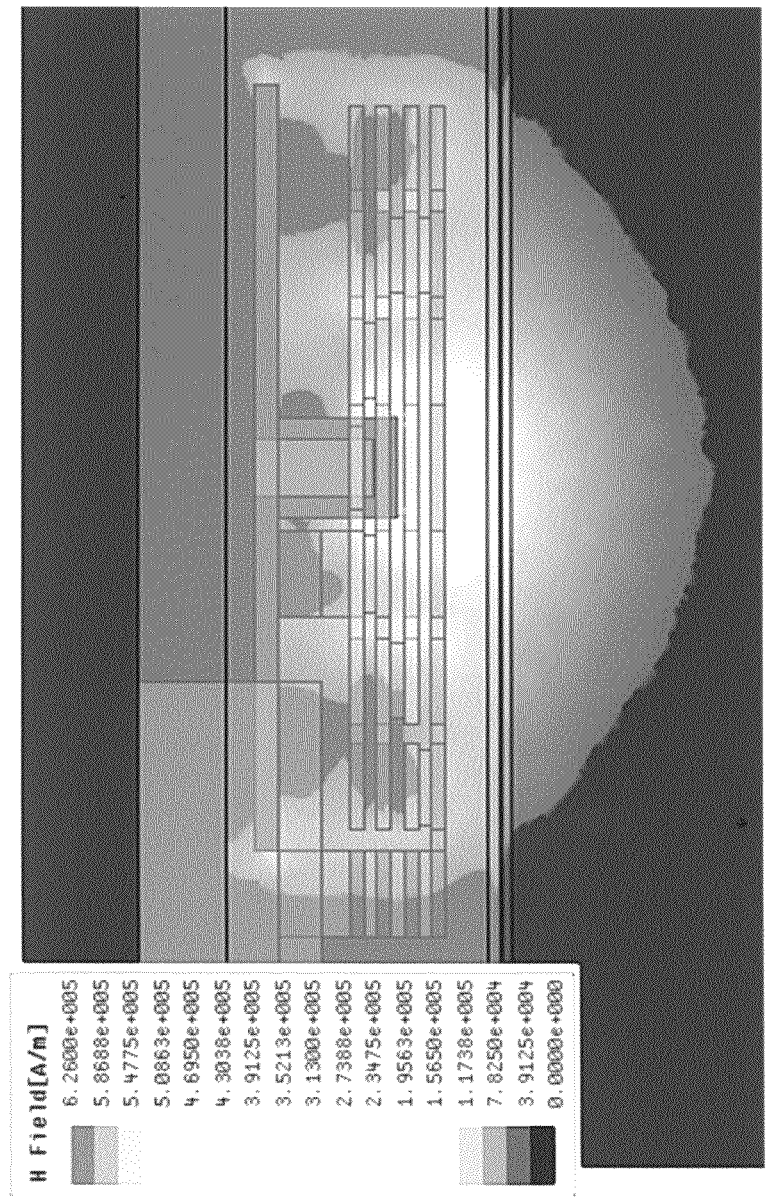
FIG. 35 is a diagram showing results of simulations by disposing a magnetic shielding film on the inductor shown in FIG. 34.
Figure 36:
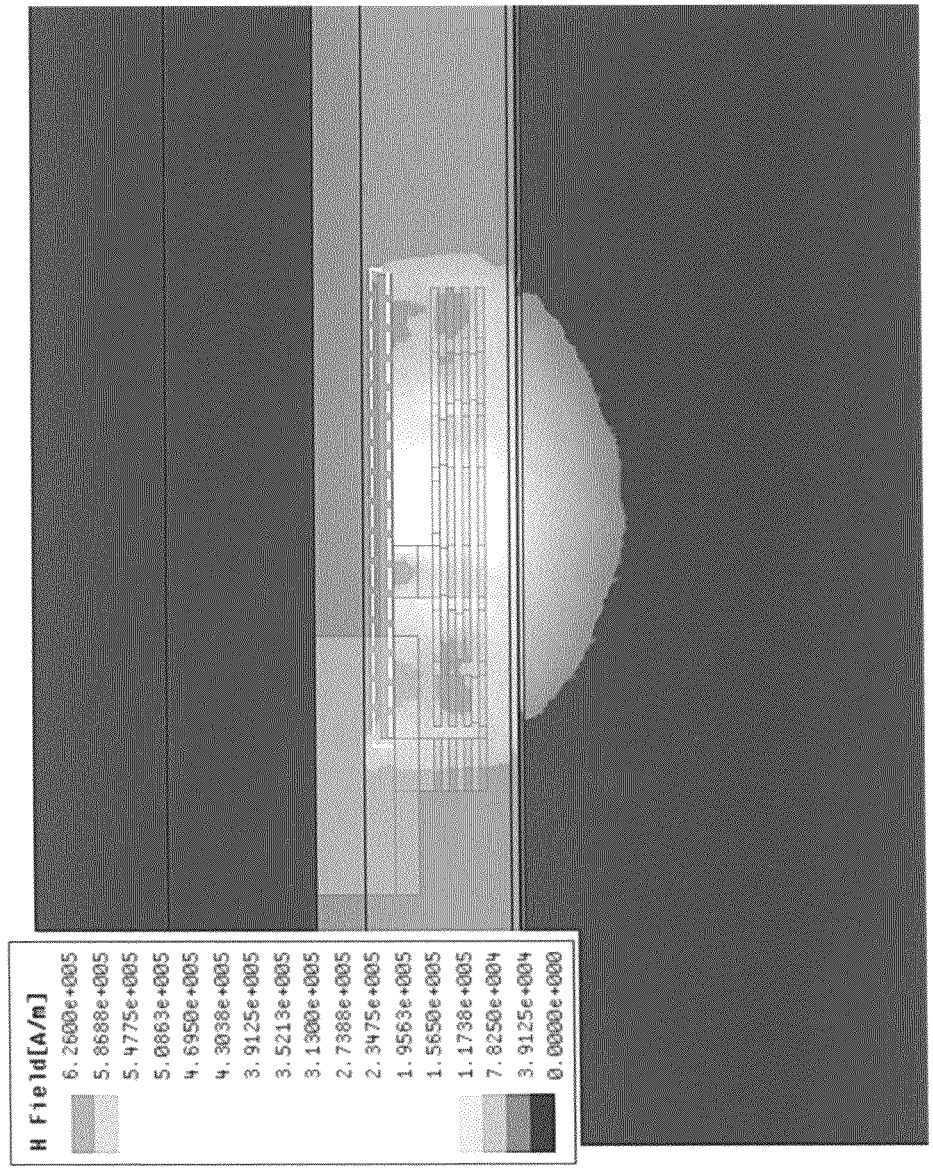
FIG. 36 is a diagram showing results of simulations by disposing a magnetic shielding film on the inductor shown in FIG. 34.

FIG. 35 and FIG. 36 are diagrams, showing results of the simulations by disposing a magnetic shielding film (electrical resistivity ρ=107 Ω/cm; permeability μ=100 (unit of permeability is no unit in CGS system) on the inductor shown in FIG. 34. In each of these simulations, a high-frequency current of 10 GHz is flowed through the inductor. In both of FIG. 35 and FIG. 36, magnetic field strength in 10 GHz is shown by a gray scale (light and shade) within a range of from 0.00 A/m to 6.26×10$^5$ A/m.

In the simulation of FIG. 35, the magnetic shielding film has a concave shape in the central region of the inductor. It is confirmed in the simulation results that the density of the magnetic flux is increased in the central region of the inductor. Since the axis of easy magnetization of the magnetic shielding film tends to be oriented toward the in-plane direction of the magnetic shielding film, the orientation of the axis of easy magnetization of the magnetic shielding film in the concave region readily meet with the orientation of the magnetic flux in the central region of the inductor. Thus, the magnetic flux density of the inductor can be effectively enhanced.

On the other hand, dotted line in FIG. 36 indicates the magnetic shielding film having a flat surface. It is confirmed that the density of the magnetic flux is increased in the central region of the inductor even in the above-described simulation results, and it is further confirmed that the simulation results of FIG. 35 exhibit more enhanced magnetic flux density than the results of FIG. 36. This is because magnetic flux density can be effectively enhanced by suitably adjusting formation of the concave shapes of the magnetic film in the magnetic flux-concentrated region in the inductor, the shape of the magnetic flux of the inductor, and the axis of easy magnetization of the magnetic film in the concave region.

Figure 38:
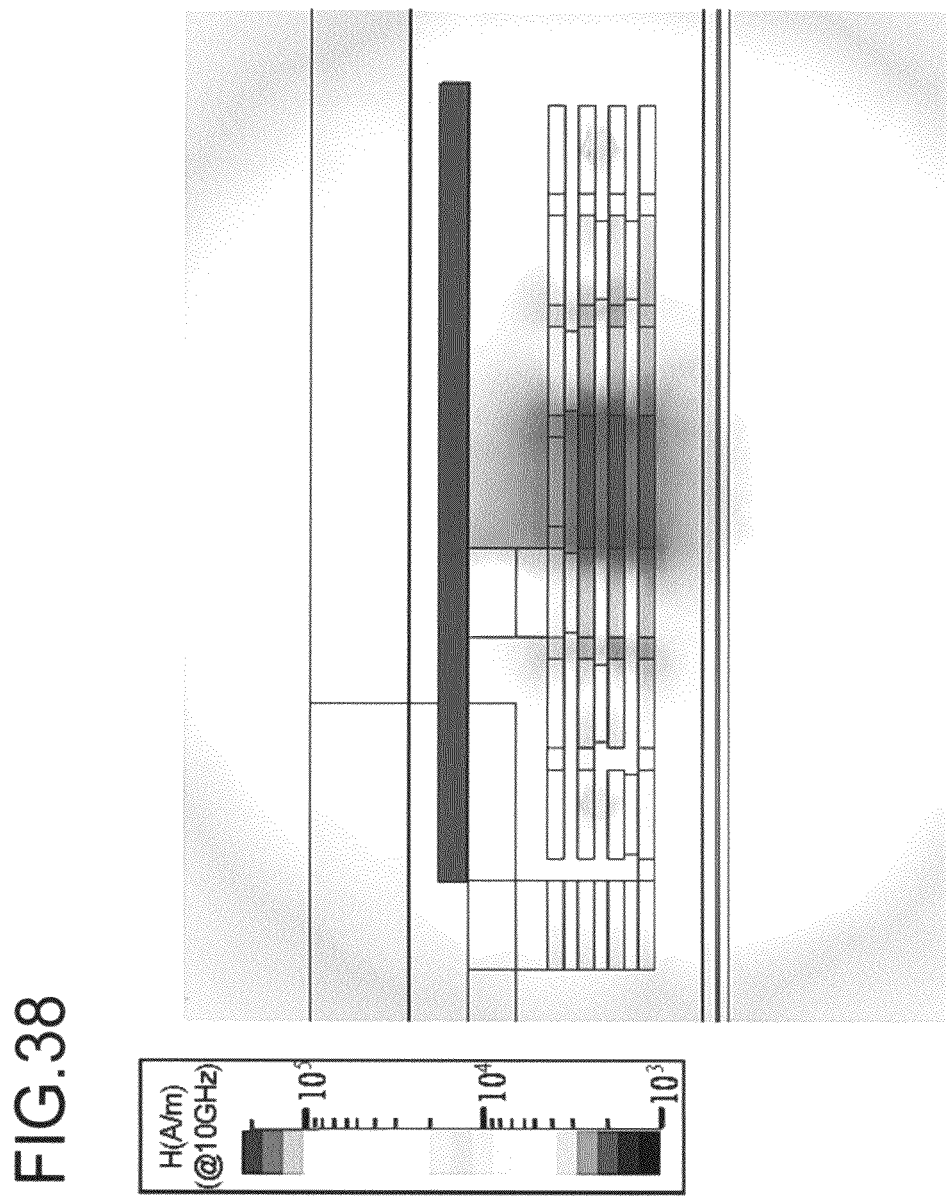
FIG. 38 is a diagram showing results of simulations by disposing a magnetic shielding film of lower loss on the inductor shown in FIG. 34.
Figure 39:
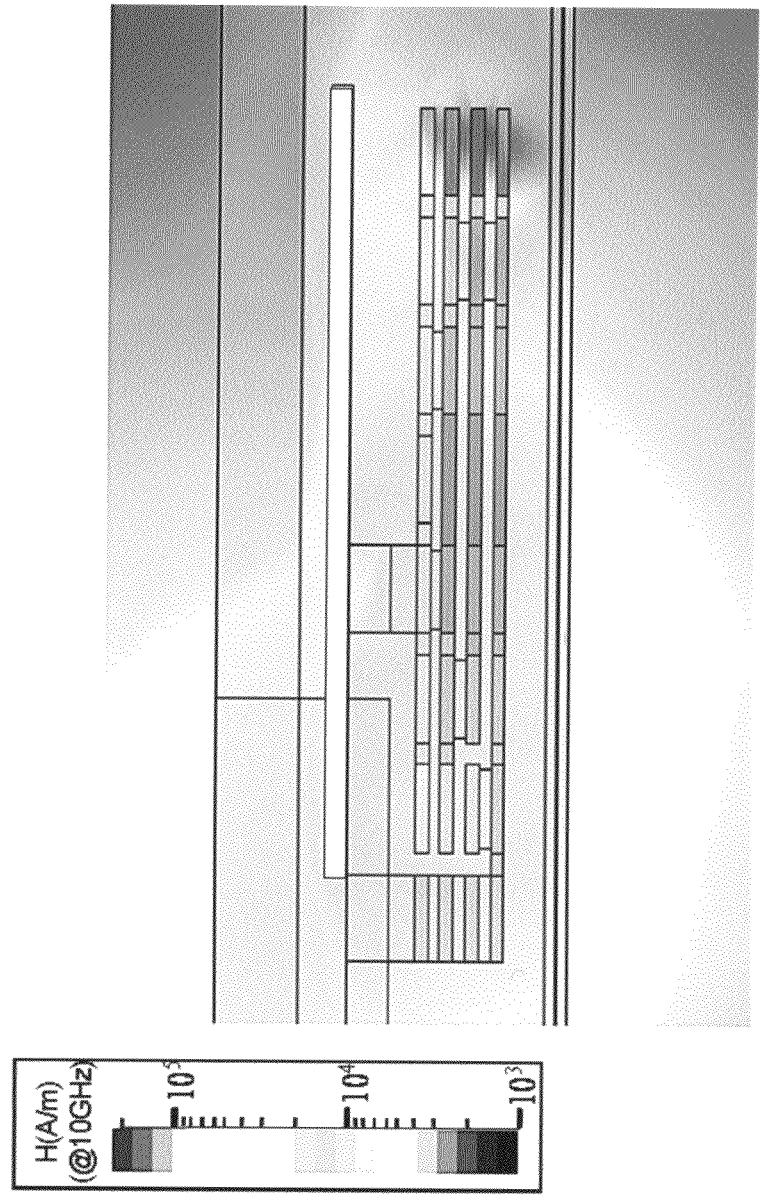
FIG. 39 is a diagram showing results of simulations by disposing a magnetic shielding film of higher loss on the inductor shown in FIG. 34.

Next, FIG. 37, FIG. 38 and FIG. 39 are diagrams, which show intensity distribution of the magnetic field, which are simulation results in the condition that high-frequency current of 10 GHz is flowed through the inductor shown in FIG. 34. FIG. 37, FIG. 38 and FIG. 39 show the intensity distribution of the magnetic field in 10 GHz within the range of from 1×10$^3$ A/m to 2×10$^5$ A/m, represented by gray scale.

In the simulation of FIG. 37, no magnetic shielding film is disposed on the inductor. In the simulation of FIG. 38, a magnetic shielding film (electrical resistivity ρ=10 MΩ/cm; permeability μ=2) having a flat surface on the inductor is disposed. The magnetic shielding film of FIG. 38 is a film of a magnetic material having electrical resistivity of 10 MΩ/cm and exhibiting lower eddy current loss. It is confirmed that the density of the magnetic flux is further increased in the central region of the inductor and the periphery thereof in the simulation result of FIG. 38, rather than in the simulation result of FIG. 37. Thus, the magnetic shielding film of FIG. 38 having electrical resistivity of 10 MΩ/cm is effective as a magnetic film for providing enhanced magnetic flux density of the inductor in GHz range band.

In the simulation of FIG. 39, a magnetic shielding film (electrical resistivity ρ=10 MΩ/cm; permeability μ=100) having a flat surface on the inductor is disposed. The resistivity and the permeability employed here are assumed to be a permeability and an electrical resistivity a general soft magnetic material such as permalloy and the like. The magnetic shielding film of FIG. 39 is a film of a magnetic material having electrical resistivity of 10 MΩ/cm and exhibiting considerably higher eddy current loss. The above-described simulation results show that no considerable magnetic shielding effect for enhancing the magnetic flux density in the inductor is present in the higher frequency of 10 GHz for the magnetic film having an electrical resistivity of 10 μΩ/cm, and the eddy current loss is extremely large, so that further decreased magnetic field intensity is present in the inductor, as compared with the configuration employing no magnetic film shown in FIG. 37. Since the magnetic film having lower resistivity (electrical resistivity ρ=10 μΩ/cm) exhibits extremely larger eddy current loss, increased performance of the inductor in GHz range band cannot be achieved.

According to the above-described simulation results, it is found that the magnetic field intensity in the central portion of the inductor is increased in GHz range band to reduce the spreading of the magnetic flux, when a magnetic film exhibiting higher resistance and lower loss were is employed for magnetic shielding film. In addition, it is also found that the magnetic field intensity is enhanced in the central region of the inductor in the configuration having the concave region of the magnetic shielding film formed in the central region of the wound wire structure of the inductor, as compared with a case of no concave region formed therein.

Figure 40A:
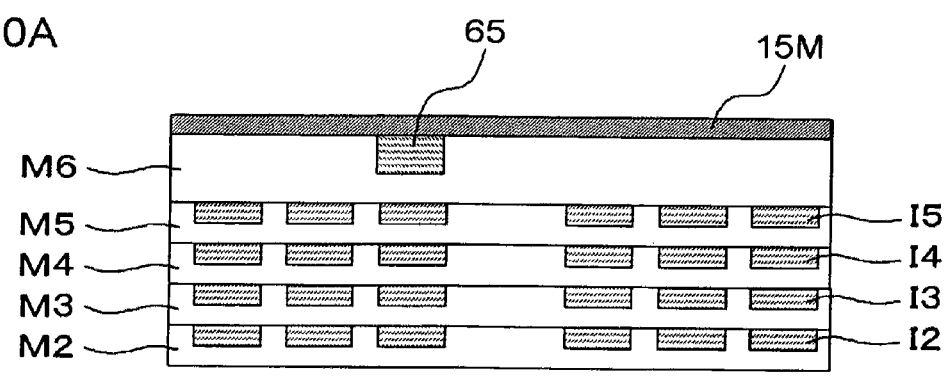
FIGS. 40A and 40B are diagrams schematically illustrating cross sections of three-dimensional spiral inductors for simulations.
Figure 40B:
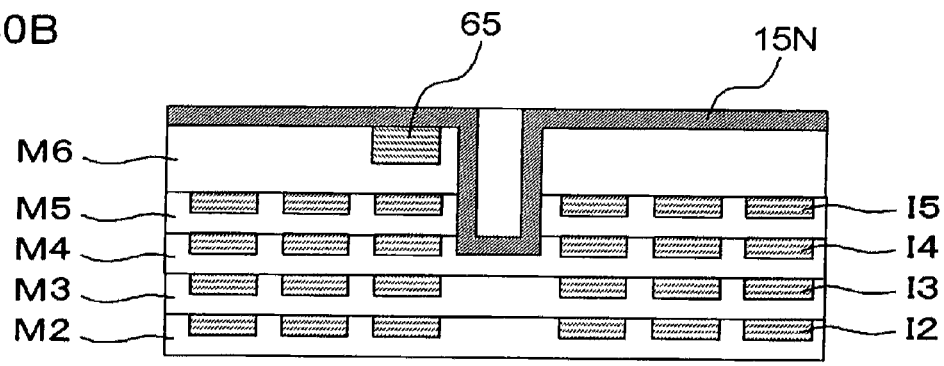

Next, other simulation results will be described. FIG. 40A and FIG. 40B are diagrams, which schematically illustrate cross-sectional views of three-dimensional spiral inductors for the present simulation. The cross sections of the three-dimensional spiral inductor of FIG. 40A and FIG. 40B are the cross sections along line A1-A2 of the three-dimensional spiral inductors shown in FIG. 34.

The three-dimensional spiral inductors of FIG. 40A and FIG. 40B include flat spiral inductors I2, I3, I4 and I5 formed in metallic interconnect layers M2, M3, M4 and M5, respectively, and an interconnect 65 formed in a metallic interconnect layer M6 and coupled to the spiral inductor I5 in the highest layer. The spiral inductors I2 to I5 are coupled in series through via hole conductors (not shown). In addition, each of the outer shapes of the spiral inductors I2 to I5 is a square shape having length on each side of about 17 μm. In the structure of FIG. 40A, a flat magnetic shielding film 15M covering the three-dimensional spiral inductor is formed. On the other hand, in the structure of FIG. 40B, a magnetic shielding film 15N covering the three-dimensional spiral inductor and having a concave region in the central region of the three-dimensional spiral inductor is formed. Both of the magnetic shielding films 15M and 15N are magnetic material films having: permeability μ=5; electrical resistivity ρ=107 Ω/cm; and thickness=500 nm.

Figure 41:
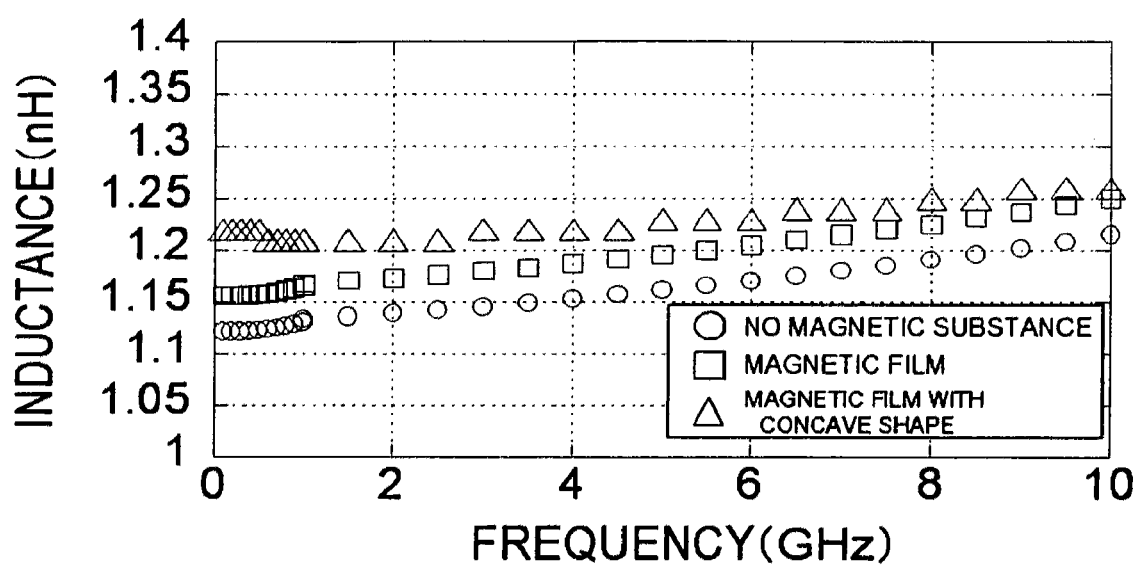
FIG. 41 is a graph, showing frequency dependency of inductance of the three-dimensional spiral inductor.
Figure 42:
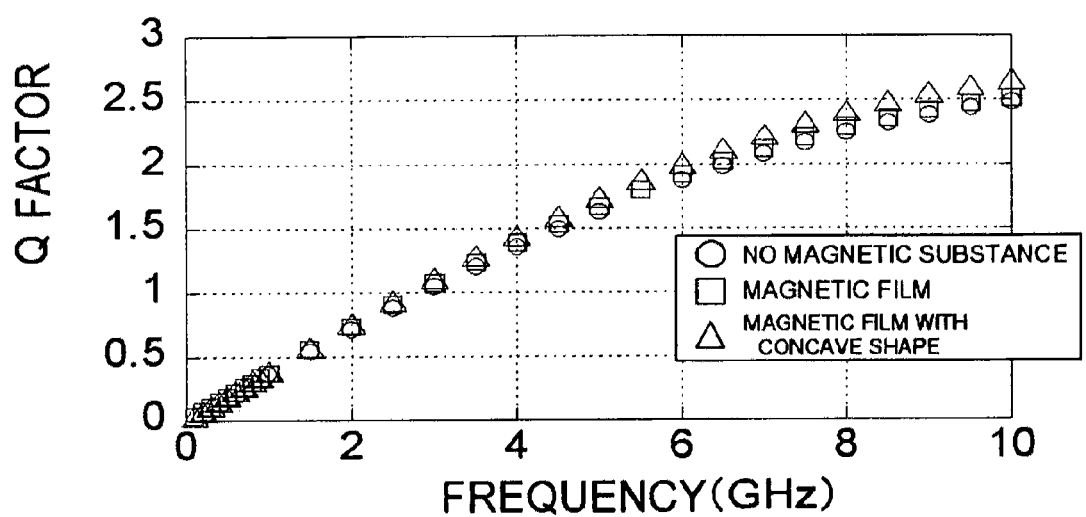
FIG. 42 is a graph, showing frequency dependency of Q factor of the three-dimensional spiral inductor.

FIG. 41 and FIG. 42 are graphs, showing simulation results for three structures of: 1) a structure having a magnetic shielding film (magnetic material thin film) 15M of FIG. 40A; 2) a structure having a magnetic shielding film (i.e., a magnetic material film in the concave region) 15N of FIG. 40B; and 3) a structure having the three-dimensional spiral inductor of FIGS. 40A and 40B but having no magnetic shielding film (magnetic material). The graph of FIG. 41 shows frequency dependency of the inductance of the three-dimensional spiral inductor, and in this graph, abscissa is associated with frequency (unit: GHz), and ordinate is associated with inductance (unit: nH). The graph of FIG. 42 shows frequency dependency of Q factor of the three-dimensional spiral inductor, and in this graph, abscissa is associated with frequency (unit: GHz), and ordinate is associated with Q factor that is inverse-proportional to energy loss.

According to graph of FIG. 41, it is seen that higher inductance is obtained in GHz range band in the case of the structure having the magnetic shielding films 15M and 15N, as compared with a structure having no magnetic shielding film. In the case of the structure having the flat magnetic shielding film (magnetic material thin film) 15M, an improvement ratio of the inductance is about 3% at 4 GHz, as compared with a structure having no magnetic shielding film (magnetic material). Further, in the case of the structure having the magnetic shielding film (i.e., a magnetic material film in the concave region) 15N, an improvement ratio of the inductance is about 8% at 4 GHz, as compared with a structure having no magnetic shielding film (magnetic material). According to the simulation results of FIG. 35 and FIG. 36, it is confirmed that the density of the magnetic flux is increased in the central region of the inductor as described above. It is also confirmed form the simulation results of FIG. 41 and FIG. 42 that the inductor performance is improved.

Further, it can be understood that higher improvement ratio of the inductance is achieved in the case of the structure having the magnetic shielding film (i.e., a magnetic material film in the concave region) 15N, as compared with the case of the structure having the flat magnetic shielding film (magnetic material thin film) 15M. The reason is that the concave region of the magnetic shielding film (magnetic material film) 15N is disposed in the magnetic flux-concentrating section of the three-dimensional spiral inductor, and the direction of the magnetic flux in the central region of the three-dimensional spiral inductor readily meet with the orientation of the axis of easy magnetization of the magnetic shielding film 15N in the concave region, so that the magnetic flux density can be effectively enhanced.

According to the graph of FIG. 42, the improvement ratio of Q factor is 2.8% in the case of the structure having the flat magnetic shielding film (magnetic material thin film) 15M, as compared with the case of the structure having no magnetic shielding film (magnetic material). Further, the improvement ratio of Q factor is 6.3% in the case of the structure having the magnetic shielding film (i.e., a magnetic material film in the concave region) 15N, as compared with the case of the structure having no magnetic shielding film (magnetic material).

Figure 43A:
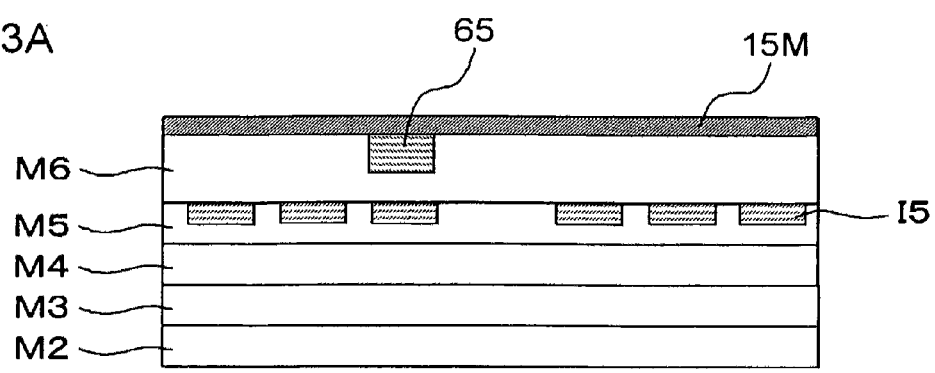
FIGS. 43A and 43B are diagrams schematically illustrating cross sections of flat spiral inductors for simulations.
Figure 43B:
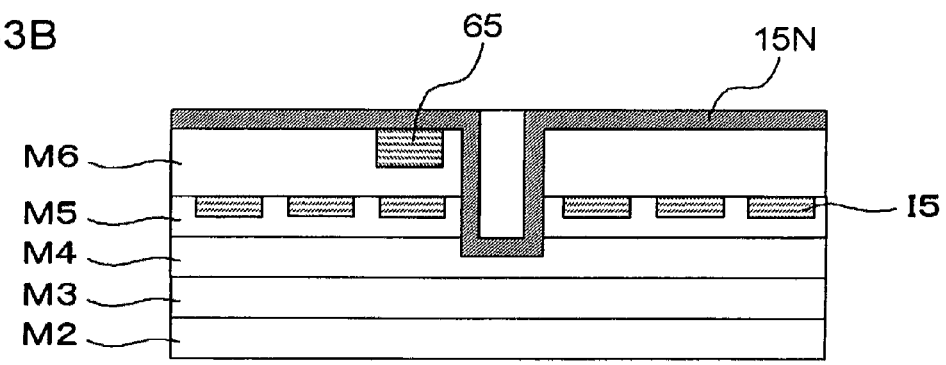

Next, simulation results for a flat spiral inductor will be described. FIG. 43A and FIG. 43B are diagrams, which schematically illustrate cross sections of flat spiral inductors in the present simulation. FIG. 44 is a perspective view of the flat spiral inductor, and the cross sections of the flat spiral inductors of FIG. 43A and FIG. 43B are cross sections along line B1-B2 of the inductor of FIG. 44.

The flat spiral inductors of FIG. 43A and FIG. 43B include a spiral inductor I5 formed only in a metallic interconnect layer M5 among metallic interconnect layers M2, M3, M4 and M5, and an interconnect 65 formed in a metallic interconnect layer M6 and coupled to the spiral inductor I5. The outer shapes of the spiral inductor I5 is a square shape having length on each side of about 17 μm. In the structure of FIG. 43A, a flat magnetic shielding film 15M covering the flat spiral inductor is formed. On the other hand, in the structure of FIG. 43B, a magnetic shielding film 15N covering the flat spiral inductor and having a concave region in the central region of the flat spiral inductor is formed. The dimension and the electromagnetism characteristics of the magnetic shielding films 15M and 15N of FIG. 43A and FIG. 43B are the same as that of the magnetic shielding film 15M and 15N of FIG. 40A and FIG. 40B.

Figure 45:
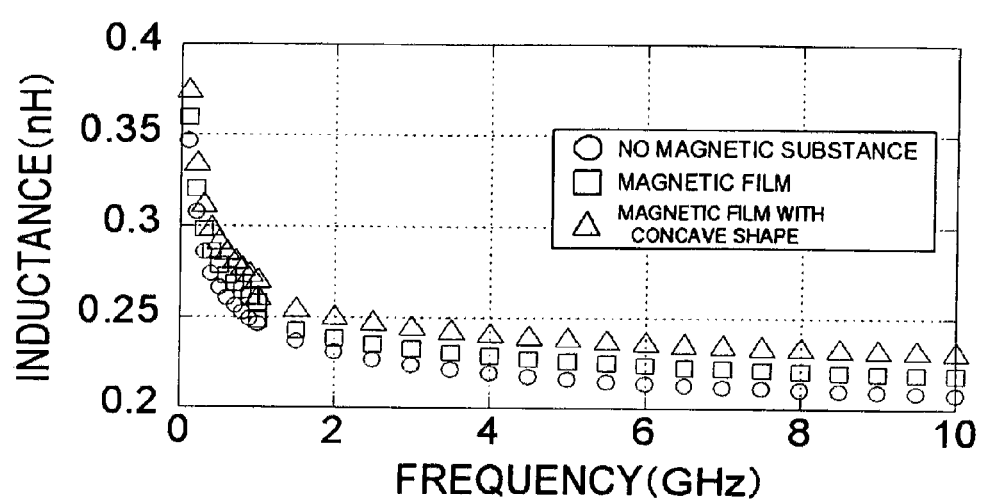
FIG. 45 is a graph, showing frequency dependency of inductance of the flat spiral inductor.
Figure 46:
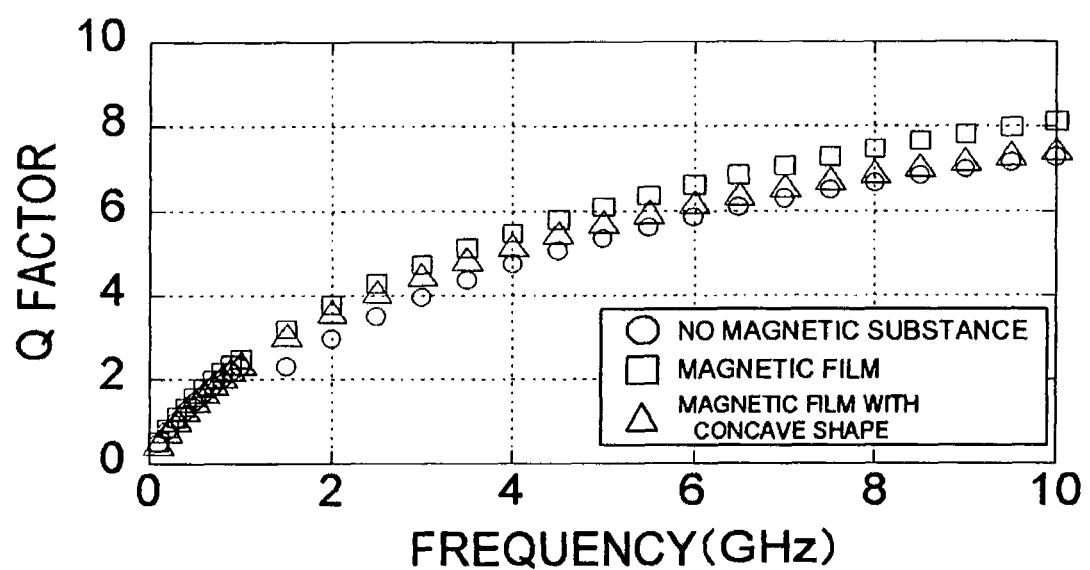
FIG. 46 is a graph, showing a frequency dependency of Q factor of the flat spiral inductor.

FIG. 45 and FIG. 46 are graphs, showing simulation results for three structures of: 1) a structure having a magnetic shielding film (magnetic material thin film) 15M of FIG. 43A; 2) a structure having a magnetic shielding film (i.e., a magnetic material film in the concave region) 15N of FIG. 43B; and 3) a structure having the flat spiral inductor of FIGS. 43A and 43B but having no magnetic shielding film (magnetic material). The graph of FIG. 45 shows frequency dependency of the inductance of the flat spiral inductor, and in this graph, abscissa is associated with frequency (unit: GHz), and ordinate is associated with inductance (unit: nH). The graph of FIG. 46 shows frequency dependency of Q factor of the flat spiral inductor, and in this graph, abscissa is associated with frequency (unit: GHz), and ordinate is associated with Q factor that is inverse-proportional to energy loss.

According to graph of FIG. 45, it is seen that higher inductance is obtained in GHz range band in the case of the structure having the magnetic shielding films 15M and 15N, as compared with a structure having no magnetic shielding film. The results are similar to the simulation results for the above-described three-dimensional spiral inductor. Further, in the case of the structure having the flat magnetic shielding film (magnetic material thin film) 15M, an improvement ratio of the inductance is about 6% at 4 GHz, as compared with a structure having no magnetic shielding film (magnetic material). Further, in the case of the structure having the magnetic shielding film (i.e., a magnetic material film in the concave region) 15N, an improvement ratio of the inductance is about 12% at 4 GHz, as compared with a structure having no magnetic shielding film (magnetic material).

According to FIG. 46, the improvement ratio of Q factor is 9.7% in the case of the structure having the flat magnetic shielding film (magnetic material thin film) 15M, as compared with the case of the structure having no magnetic shielding film (magnetic material). Further, the improvement ratio of Q factor is 15.7% in the case of the structure having the magnetic shielding film (i.e., a magnetic material film in the concave region) 15N, as compared with the case of the structure having no magnetic shielding film (magnetic material). The reason of the improvement in Q factor is that the magnetic shielding effect provides a improved magnetic efficiency, and further, the inducing magnetic flux in the inductor is not spread, so that eddy current loss is reduced in locations of the semiconductor substrate (for example, silicon substrate) where the resistance is lower.

The simulation results have been described as above. While the magnetic shielding effect confirmed in the above-described simulation is not limited to the geometry of the inductor located under the magnetic shielding film, the level of the magnetic shielding effect varies by the magnetic field distribution created by the inductor. It is confirmed by the above-described simulation results that the magnetic shielding effect can be sufficiently exhibited by employing the magnetic shielding film in a structure that promotes spreading the inducing magnetic flux of the inductor and provides reduced magnetic efficiency. Further, it is also confirmed that, when the magnetic shielding film of higher resistance such as Ni—Zn based ferrite film is employed, reduced eddy current loss and enhanced inductor performance (inductance and Q factor) can be achieved in GHz range band.

While the magnetic shielding film composed of monolayer is employed in the above-described simulations, it is obvious that similar simulation result can be obtained even if a multiple-layered structure as the magnetic shielding structure 70 shown in FIG. 23I is employed.

Figure 47:
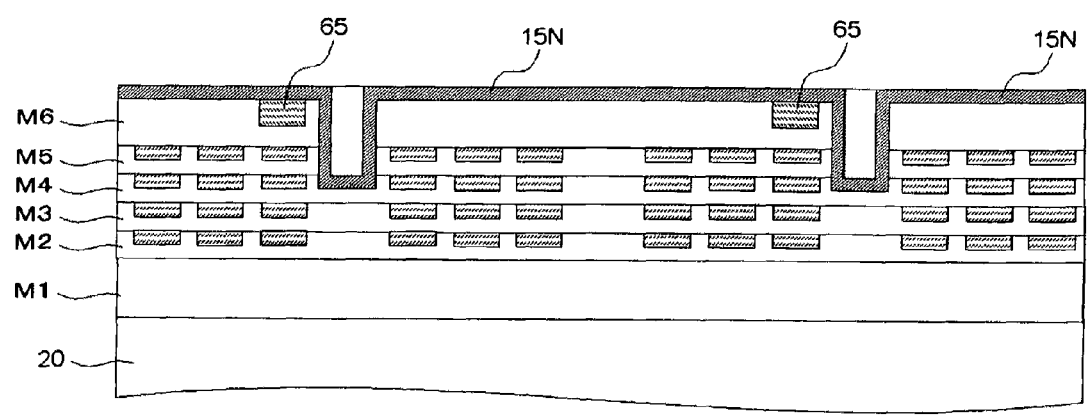
FIG. 47 is a cross-sectional view, which schematically shows two three-dimensional spiral inductors formed in parallel.

FIG. 47 is a cross-sectional view, which schematically shows two three-dimensional spiral inductors formed in parallel on one semiconductor substrate 20. The three-dimensional spiral inductors have structures that are similar to the structure of the three-dimensional spiral inductor shown in FIG. 40A, respectively, and formed on the interconnect layer M1. Since the spread of the magnetic flux density of each of the three-dimensional spiral inductors is inhibited by the magnetic shielding film 15N, the inductive coupling among these three-dimensional spiral inductors is hardly occurred, inhibiting a generation of cross talk. Thus, the three-dimensional spiral inductors can be densely arranged with reduced horizontal distance between three-dimensional spiral inductors. In addition to above, the present embodiment is not limited to the configuration where two three-dimensional spiral inductors are formed in parallel on the semiconductor substrate 20, and a configuration where a spiral three-dimensional spiral inductor and a flat inductor are formed in parallel on a semiconductor substrate, or a configuration where three or more inductors are formed in parallel on the semiconductor substrate 20 may also be applicable.

While various embodiments of the present invention has been fully described in reference to the annexed figures, it is intended to present these embodiments for the purpose of illustrations of the present invention only, and various types of other configurations are also available. For example, while four to seven layers are employed for constituting the multiple-layered interconnect structure in the above-described embodiments, the configuration thereof is not limited thereto. Eight or more layers may alternatively be adopted for constituting the multiple-layered interconnect structure. Further, while the dual-layer structure of the inductor 62 is adopted in first embodiment, the configuration thereof is not limited thereto, and a configuration of the three or more layers may alternatively be adopted.

The upper buffer film 16 is deposited on the magnetic shielding films 15A to 15E that are processed into predetermined shapes and sizes in the second embodiment, no limitation thereto intended. The upper buffer film 16 may alternatively be deposited on the magnetic shielding film 15 having a flat surface shown in FIG. 1.

As described above, the concave regions 35, 36 and 37 are formed in the third embodiment. The location, the shape and/or the number of these concave regions 35, 36 and 37 are not limited. For example, etching depth for the concave region 36 may be larger than the etching depth shown in FIG. 20B.

Further, as shown in FIG. 23I in the third embodiment, the magnetic shielding structure 70 is formed. The magnetic shielding structure 70 covers only the region in which the inductor is formed, no limitation thereto intended. The magnetic shielding structure may be formed to cover only other interconnects that may be potential sources for noise, instead of covering the interconnects constituting the inductor.

While the semiconductor apparatus 10C of the above-described fifth embodiment includes the nonvolatile memory cells that utilize the TMR effect, the configuration thereof is not limited thereto. The semiconductor apparatus of the fifth embodiment may preferably includes a memory cell that utilizes a magnetoresistance effect that varies the electric resistance according to a combination of spin state of pair of ferromagnetic materials, in addition to utilization of the TMR effect. For example, giant magnetoresistive (GMR) effect may be utilized.

As described above, according to another aspect of the present invention, a method for manufacturing a semiconductor apparatus is provided. The method includes the steps of: a) forming a semiconductor device on a principal surface of a substrate, the semiconductor device including an interconnect layer; b) forming a buffer film which covers the semiconductor device and prevents diffusion of a magnetic material; and c) forming a magnetic shielding film which covers the buffer film and is composed of the magnetic material.

In the method, the magnetic material can be a ferrite material having a spinel-type crystal structure. The ferrite material can contain, as a main component, at least one oxide magnetic material of $XFe_2O_4$ and $Y_{1-n}Z_nFe_2O_4$, where: X is one chemical element selected from the group consisting of nickel (Ni), zinc (Zn), copper (Cu), cobalt (Co), manganese (Mn) and iron (Fe); Y is one chemical element selected from the group consisting of Ni, Zn, Cu, Co and Mn; and Z is one chemical element selected from the group consisting of Ni, Zn, Cu, Co and Mn.

The magnetic shielding film can be formed to have a (311) crystal face oriented along a film-thickness direction thereof.

The buffer film can be formed to be a film containing at least one chemical element selected from the group consisting of tungsten (W), tantalum (Ta), titanium (Ti) and ruthenium (Ru). Alternatively, the buffer film can be formed to include a nitride or oxide film containing at least one chemical element selected from the group consisting of W, Ta, Ti and Ru.

In the method, the buffer film and the magnetic shielding film are formed such that the buffer film contains tantalum nitride (TaN) as a main component, and the magnetic shielding film has a (311) crystal face oriented along a film-thickness direction thereof.

Alternatively, the buffer film and the magnetic shielding film are formed such that the buffer film contains tantalum nitride (TaN) as a main component, and the magnetic shielding film has a (400) crystal face oriented along a film-thickness direction thereof.

Still, alternatively, the buffer film and the magnetic shielding film are formed such that the buffer film contains Ti as a main component, and the magnetic shielding film has at least one crystal face selected from the group consisting of a (111) crystal face, a (222) crystal face and a (333) crystal face, as a crystal face oriented along a film-thickness direction thereof.

The method can further include the step of forming an insulating film covering the semiconductor device, after the semiconductor device is formed, where the magnetic shielding film is formed to cover the insulating film. The method can still further include the step of etching the insulating film to form a concave or convex region in the insulating film, where the buffer film and the magnetic shielding film are formed extending along faces of the concave or convex regions.

The method can further include the step of forming an upper buffer film which continuously covers the magnetic shielding film.

In the above-described method, the magnetic shielding film can be formed to selectively cover an upper surface of the semiconductor device. An interconnect layer of this semiconductor device can constitute an inductor, and the magnetic shielding film can be formed to cover at least a region in which the inductor is formed. An interconnect composing this inductor can be formed to have a spiral pattern, and the magnetic shielding film can have a concave shape in a central region of this inductor.

Alternatively, in the above-described method, the semiconductor device can include a memory cell having the interconnect layer and can include a magnetoresistive device electrically coupled to the interconnect layer, where the magnetic shielding film is formed to cover at least a region in which the memory cell is formed.

In the method, the buffer film and the magnetic shielding film can be formed at a process temperature of equal to or lower than 400 degrees Centigrade.

It is apparent that the present invention is not limited to the above embodiment, and may be modified and changed without departing from the scope and spirit of the invention.

What is claimed is:

1. A method for manufacturing a semiconductor apparatus, said method comprising:
    forming a semiconductor device on a principal surface of a substrate, said semiconductor device including an interconnect layer that comprises an inductor disposed in multilayers of the interconnect layer;
    forming a buffer film which covers said semiconductor device and prevents diffusion of a magnetic material that covers the inductor; and
    forming a magnetic shielding film which covers said buffer film and comprises said magnetic material.

2. The method for manufacturing the semiconductor apparatus according to claim 1, wherein said magnetic material comprises a ferrite material having a spinel-type crystal structure.

3. The method for manufacturing the semiconductor apparatus according to claim 2, wherein the ferrite material comprises, as a main component, at least one oxide magnetic material of $XFe_2O_4$ and $Y_{1-n}Z_nFe_2O_4$, where:
    X comprises one chemical element selected from the group consisting of nickel (Ni), zinc (Zn), copper (Cu), cobalt (Co), manganese (Mn), and iron (Fe);
    Y comprises one chemical element selected from the group consisting of Ni, Zn, Cu, Co, and Mn; and
    Z comprises one chemical element selected from the group consisting of Ni, Zn, Cu, Co and Mn.

4. The method for manufacturing the semiconductor apparatus according to claim 2, wherein said magnetic shielding film comprises a (311) crystal face oriented along a film-thickness direction thereof.

5. The method for manufacturing the semiconductor apparatus according to claim 2, wherein said buffer film comprises a film comprising at least one chemical element selected from the group consisting of tungsten (W), tantalum (Ta), titanium (Ti), and ruthenium (Ru).

6. The method for manufacturing the semiconductor apparatus according to claim 2, wherein said buffer film includes a nitride or an oxide film comprising at least one chemical element selected from the group consisting of W, Ta, Ti, and Ru.

7. The method for manufacturing the semiconductor apparatus according to claim 2, wherein said buffer film comprises tantalum nitride (TaN) as a main component, and
    wherein said magnetic shielding film comprises a (311) crystal face oriented along a film-thickness direction thereof.

8. The method for manufacturing the semiconductor apparatus according to claim 2, wherein said buffer film comprises tantalum nitride (TaN) as a main component, and
    wherein said magnetic shielding film has a (400) crystal face oriented along a film-thickness direction thereof.

9. The method for manufacturing the semiconductor apparatus according to claim 2, wherein said buffer film comprises Ti as a main component, and
    wherein said magnetic shielding film comprises at least one crystal face selected from the group consisting of a (111) crystal face, a (222) crystal face, and a (333) crystal face, as a crystal face oriented along a film-thickness direction thereof.

10. The method for manufacturing the semiconductor apparatus according to claim 1, further comprising forming an insulating film covering said semiconductor device, after said semiconductor device is formed,
    wherein said magnetic shielding film is formed to cover said insulating film.

11. The method for manufacturing the semiconductor apparatus according to claim 10, further comprising etching said insulating film to form a concave or a convex region in said insulating film,
    wherein said buffer film and said magnetic shielding film extend along faces of said concave or convex regions.

12. The method for manufacturing the Semiconductor apparatus according to claim 1, further comprising forming an upper buffer film which continuously covers said magnetic shielding film.

13. The method for manufacturing the semiconductor apparatus according to claim 12, wherein said semiconductor device includes a memory cell comprising said interconnect layer and includes a magnetoresistive device electrically coupled to said interconnect layer, and
    wherein said magnetic shielding film is formed to cover at least a region in which said memory cell is formed.

14. The method for manufacturing the semiconductor apparatus according to claim 1, wherein said magnetic shielding film is formed to selectively cover an upper surface of said semiconductor device.

15. The method for manufacturing the semiconductor apparatus according to claim 14, wherein the inductor is embedded within the interconnect layer of said semiconductor device, and
    wherein said magnetic shielding film is formed to cover at least a region in which said inductor is formed.

16. The method for manufacturing the semiconductor apparatus according to claim 14, wherein an interconnect comprising said inductor is formed to include a spiral pattern, and
    wherein said magnetic shielding film has a concave shape in a central region of said inductor.

17. The method for manufacturing the semiconductor apparatus according to claim 1, wherein said buffer film and said magnetic shielding film are formed at a process temperature of equal to or lower than 400 degrees Centigrade.

18. The method for manufacturing the semiconductor apparatus according to claim 1, wherein said magnetic shielding film comprises at least one crystal face selected from the group consisting of a (311) crystal face, a (400) crystal face, a (111) crystal face, a (222) crystal face, and a (333) crystal face, as a crystal face oriented along a film-thickness direction thereof.

19. The method for manufacturing the semiconductor apparatus according to claim 1, wherein said magnetic shielding film has a concave shape in a central region of said inductor.

* * * * *